United States Patent [19]

Schimpe

[11] Patent Number: 4,743,083
[45] Date of Patent: May 10, 1988

[54] CYLINDRICAL DIFFRACTION GRATING COUPLERS AND DISTRIBUTED FEEDBACK RESONATORS FOR GUIDED WAVE DEVICES

[76] Inventor: Robert M. Schimpe, Prinz-Karl-Strasse 40, D-8130 Starnberg, Fed. Rep. of Germany

[21] Appl. No.: 814,612

[22] Filed: Dec. 30, 1985

[51] Int. Cl.$^4$ ............ G02B 6/34; G02B 6/00; G02B 27/42; G02B 27/44
[52] U.S. Cl. .............. 350/96.19; 350/96.10; 350/96.12; 350/162.12; 350/162.16
[58] Field of Search ............... 350/96.10, 96.12, 96.13, 350/96.14, 96.19, 3.72, 162.21, 162.24, 162.12, 162.15, 162.16

[56] References Cited

U.S. PATENT DOCUMENTS

| | | | |
|---|---|---|---|
| 3,970,959 | 3/1976 | Wang et al. | 331/94.5 |
| 3,995,937 | 12/1976 | Baues et al. | 350/96.12 X |
| 4,006,432 | 7/1977 | Streifer et al. | 331/94.5 |
| 4,027,946 | 6/1977 | Tsai | 350/96.12 |
| 4,138,190 | 2/1979 | Bryngdahi | 350/162.15 X |
| 4,140,362 | 5/1979 | Tien | 350/162 |
| 4,155,056 | 5/1979 | Cross et al. | 350/96.12 X |
| 4,194,162 | 3/1980 | Uematsu et al. | 350/96.19 X |
| 4,210,391 | 7/1980 | Cohen | 350/162.16 X |
| 4,327,340 | 4/1982 | Coldren | 350/96.12 X |
| 4,440,468 | 3/1984 | Auracher et al. | 350/162.24 X |
| 4,498,184 | 2/1985 | O'Meara | 350/162.16 X |
| 4,640,574 | 2/1987 | Unger | 350/96.12 X |

FOREIGN PATENT DOCUMENTS 1443750 7/1976 United Kingdom ............. 350/96.12

OTHER PUBLICATIONS

"Circular and Spiral Gratings" by Dyson, Proc. Royal Soc. London Ser. A248, dated 1958, pp. 93–106.
"Double-Heterostructure GaAs Distributed-Feedback Laser" by Schmidt et al., Appl. Physics letters 25, pp. 200-201, dated 1974.
"Antisymmetric Taper of Distributed Feedback Lasers" IEEE J. Quantum Elect. vol. QE12, No. 9, dated 1976, pp. 532-539.
"Planar Distributed-Feedback Optical Resonators", Soc. Phys. Tech. Phys., vol. 21, No. 2, dated 1976, pp. 130-136, by Kazarinov et al.
"Design Considerations of the Metal-Clad Ridge--Waveguide Laser with Distributed Feedback", by Schimpe, IEE Proc. vol. 132, Pt. J. No. 2, 1985, pp. 133-135.
"Semiconductor Laser with Extremely Low Divergence of Radiation" by Alferov et al, Soviet Physics Semiconductors, vol. 8, No. 4, dated 1974, pp. 541-542.
"1.5 Micron Phase-Shifted DSB Lasers for Single Mode Operation" by Sekartedjo et al, Electronics Letters, vol. 20, No. 2, dated 1984, pp. 80-81.
"Mikrowellen Antennen" by Kuhn, pp. 628-629.
"Use of a Concentric-Arc Grating as a Thin-Film Spectograph for Guided Waves" by Tien, Appl. Phys. Lett., vol. 37, No. 6, dated 1980, pp. 524-526.

(Continued on next page.)

Primary Examiner—William L. Sikes
Assistant Examiner—Akm E. Ullah
Attorney, Agent, or Firm—Karl F. Milde, Jr.

[57] ABSTRACT

Devices for controlling and guiding waves, such as electromagnetic waves, acoustic waves, and the like are disclosed which include at least one wave-transmitting medium and a diffraction grating, associated with the transmitting medium, for scattering wave energy into or out of the guided waves. The device may take the form of a "sandwich"-type or thin film waveguide, in which case the transmitting medium has at least one curvi-planar boundary, or it may take the form of a "rod"-shaped or cylindrical waveguide, in which case the transmitting medium has a substantially cylindrical boundary. According to the invention, the diffraction grating comprises a large number of substantially closed loop grating lines consecutively enclosing each other from inner to outer, with all of the grating lines extending substantially parallel to the phase fronts of the guided waves.

37 Claims, 24 Drawing Sheets

OTHER PUBLICATIONS

"Second Order Distributed Feedback Lasers with Mode Provided by First-Order Radiation Losses" by Kazarinov, IEEE J. Quantum Elect., vol. QE-21, No. 2, dated 1985, pp. 144–150.

"Surface Emitting GaInAsP/InP Laser with Low Threshold Current and High Efficiency" by Liau et al, Appl. Phys Lett., vol. 46, No. 2, dated 1985, pp. 115–117.

"Room Temperature Pulsed Oscillation of GaAlAs/GaAs Surface Emitting Junction Laser" by Iga et al, IEEE J. Quantum Elect, vol. QE-21, No. 6, dated 1985, pp. 663–667.

"Phased Matched Second Harmonic Generation by a Surface Polarition Along a Silver Layer on a Slab-Type Optical Waveguide" by Sasaki et al. Appl. Phys. Lett. vol. 47, No. 8, dated 1985, pp. 783–785.

"Enhanched Quantum Efficiency Internal Photoemission Detectors by Grating Coupling to Surface Plasma Waves" by Bruek et al, Appl. Phys. Lett., vol. 46, No. 10, dated 1985, pp. 916–917.

"The Influence of the Hologram Surface Curvature on the Holographic Imaging Quality" by Jagoszewski, Jun. 1984. Optik 69, No. 2 (1985), pp. 85–88.

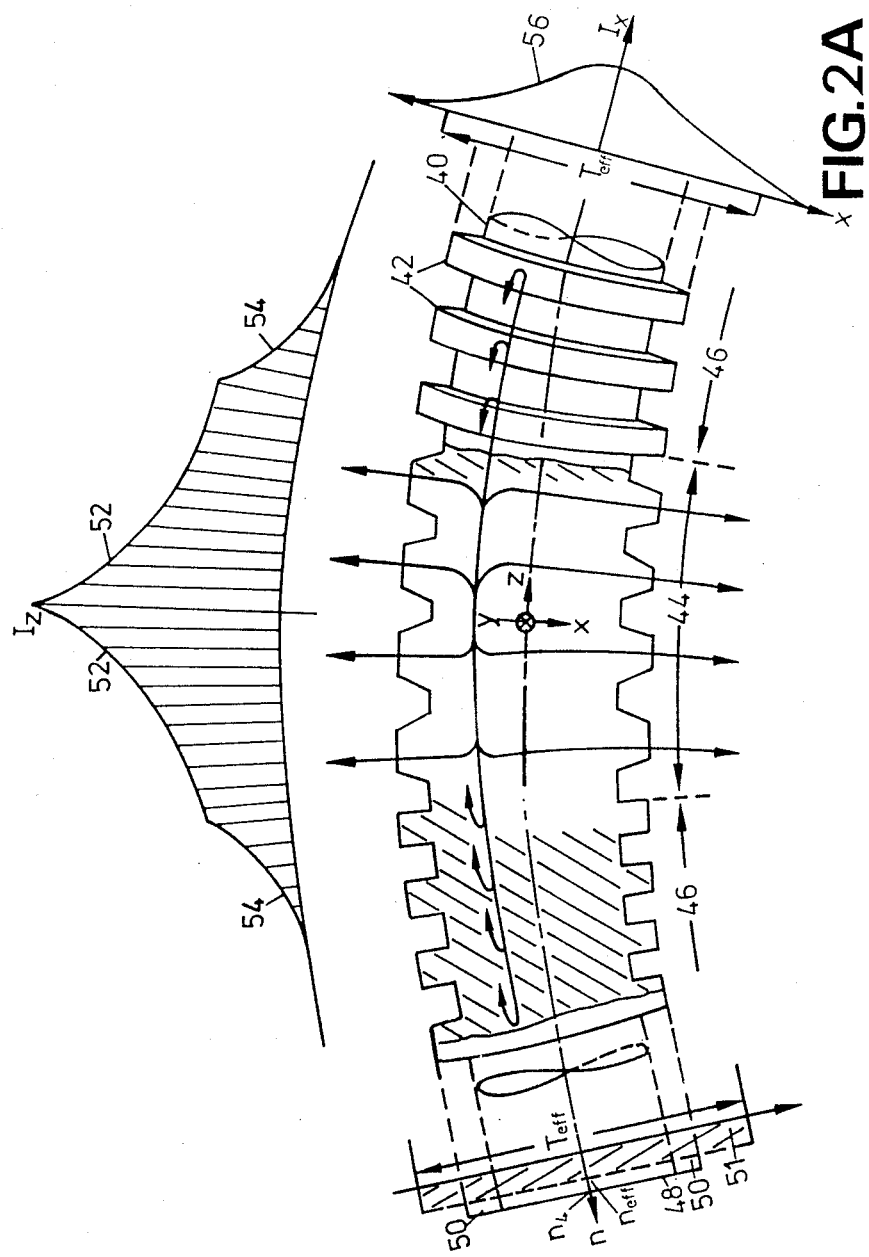

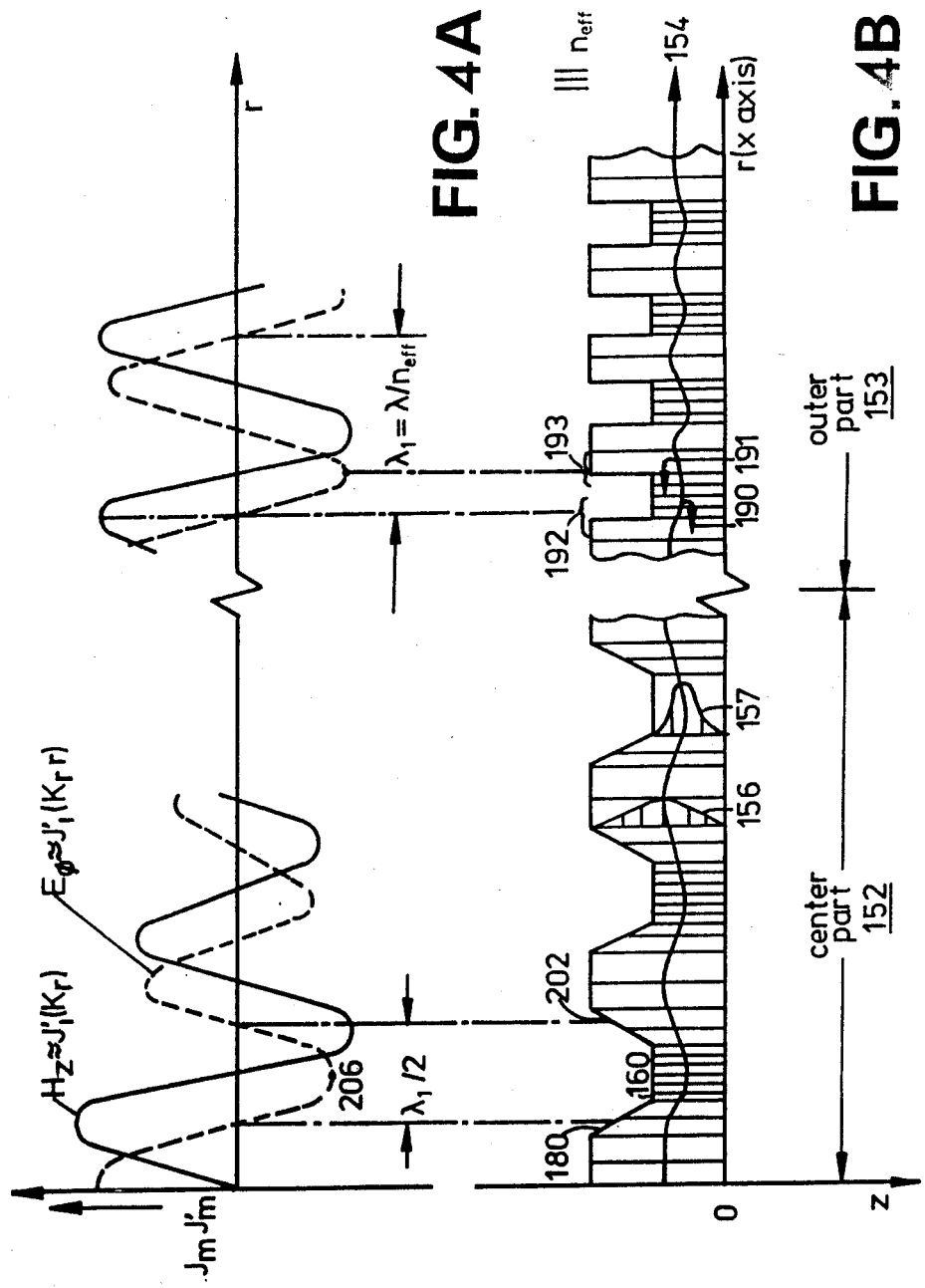

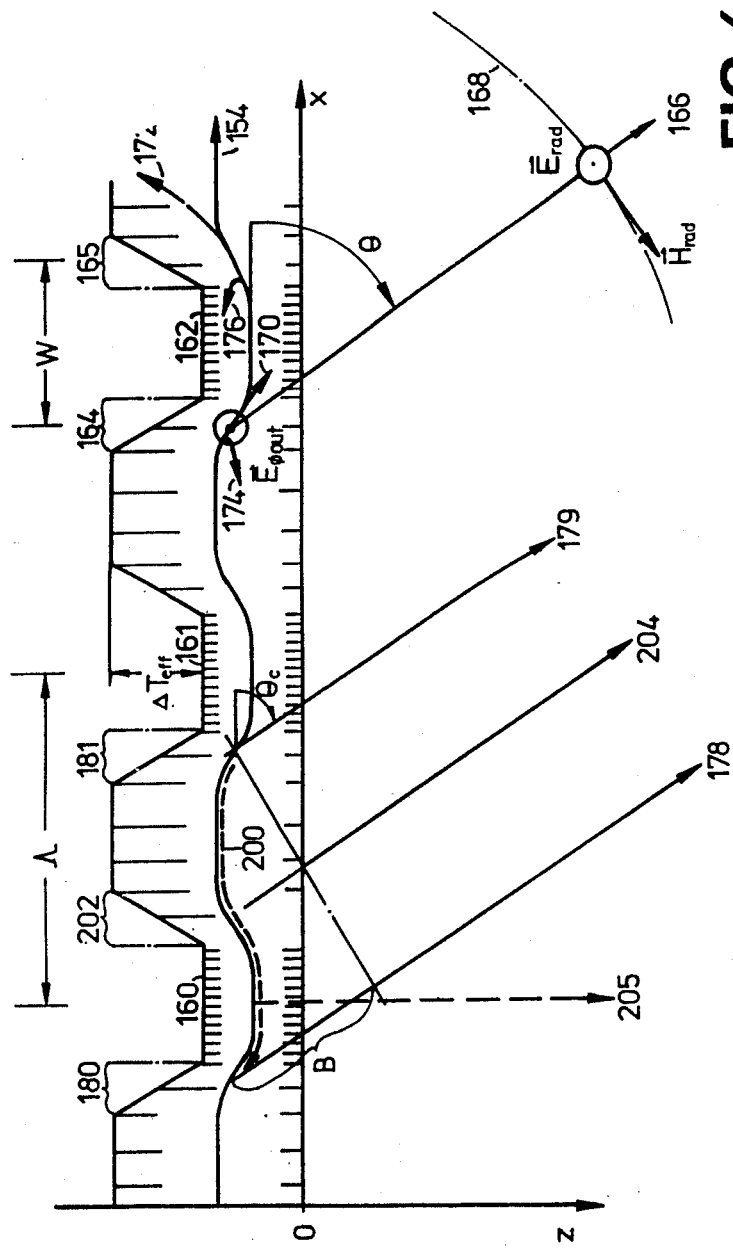

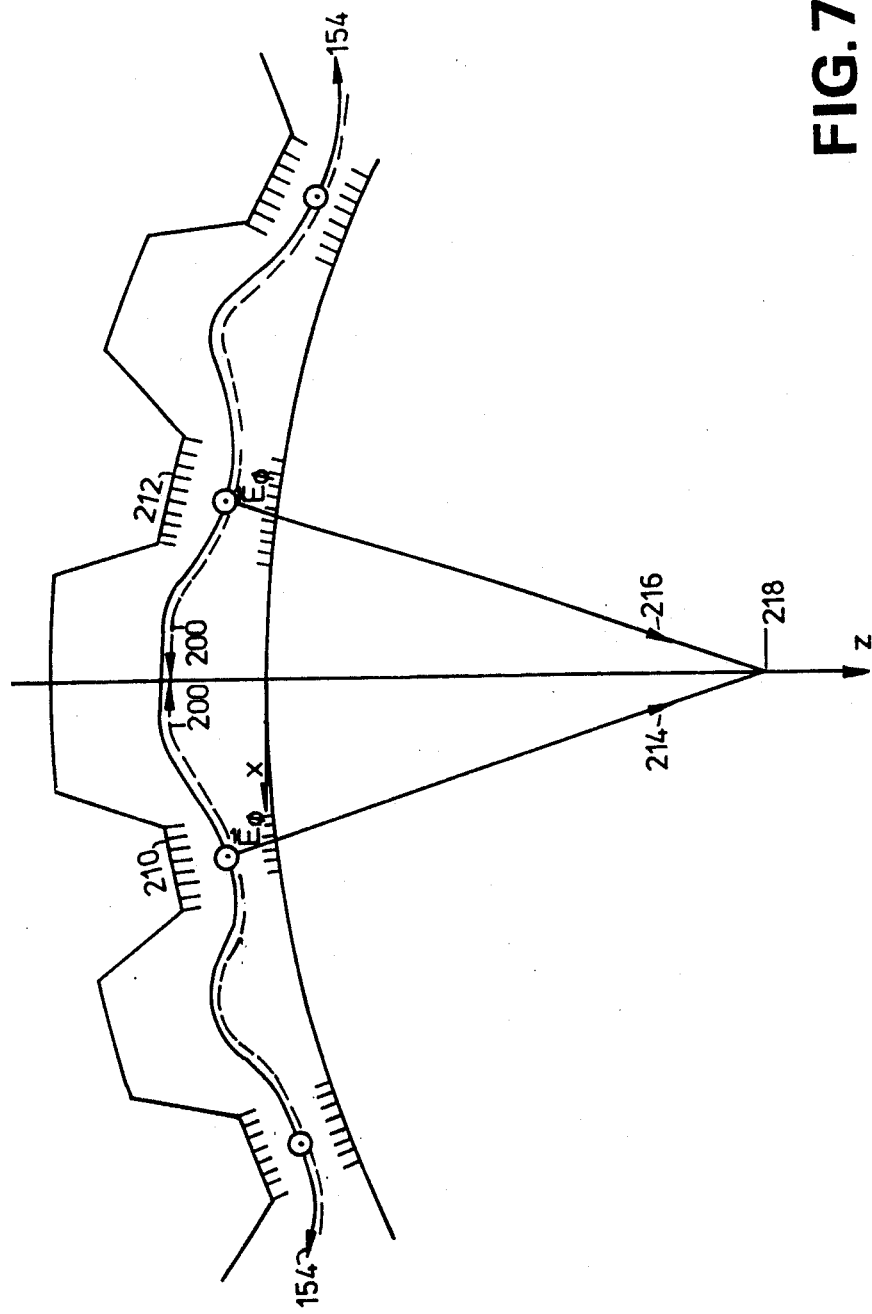

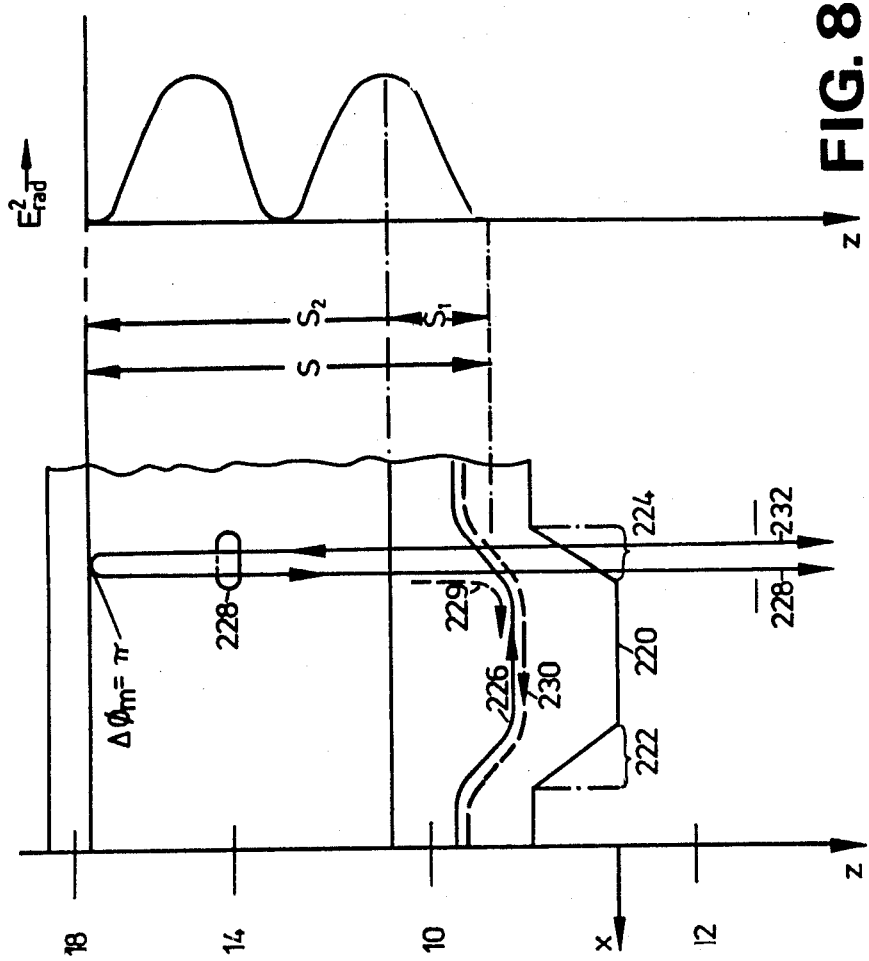

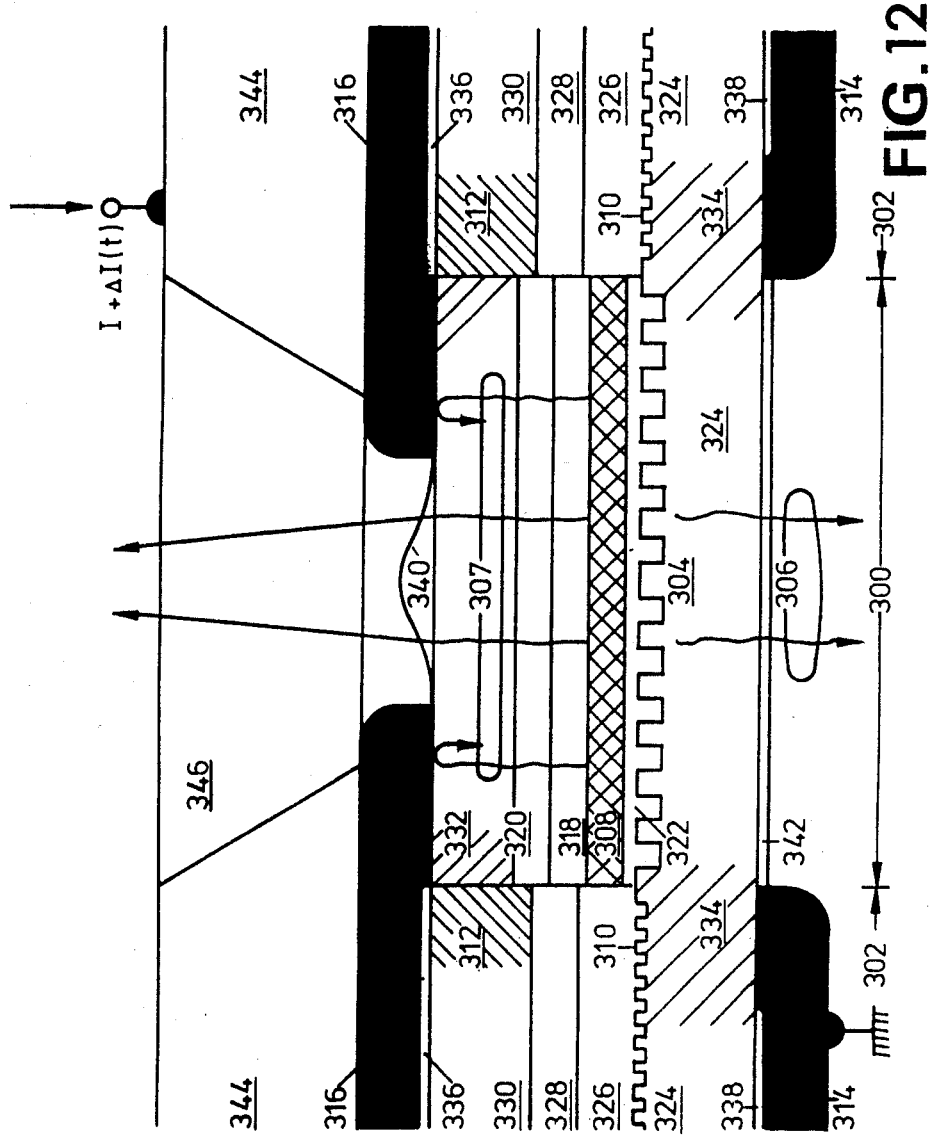

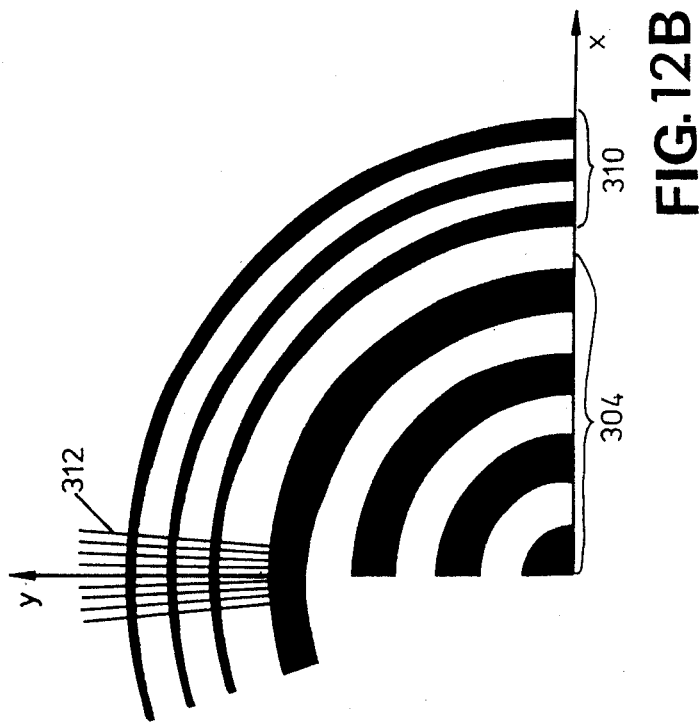

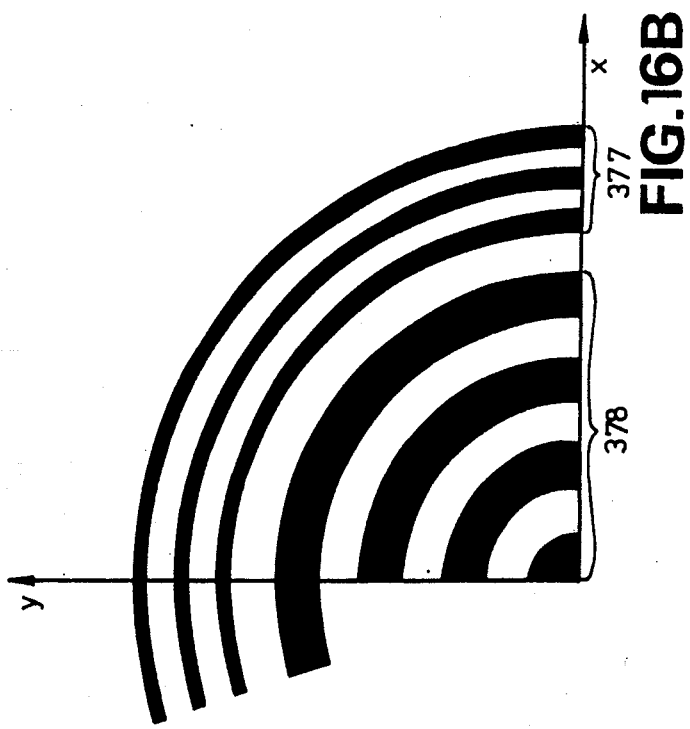

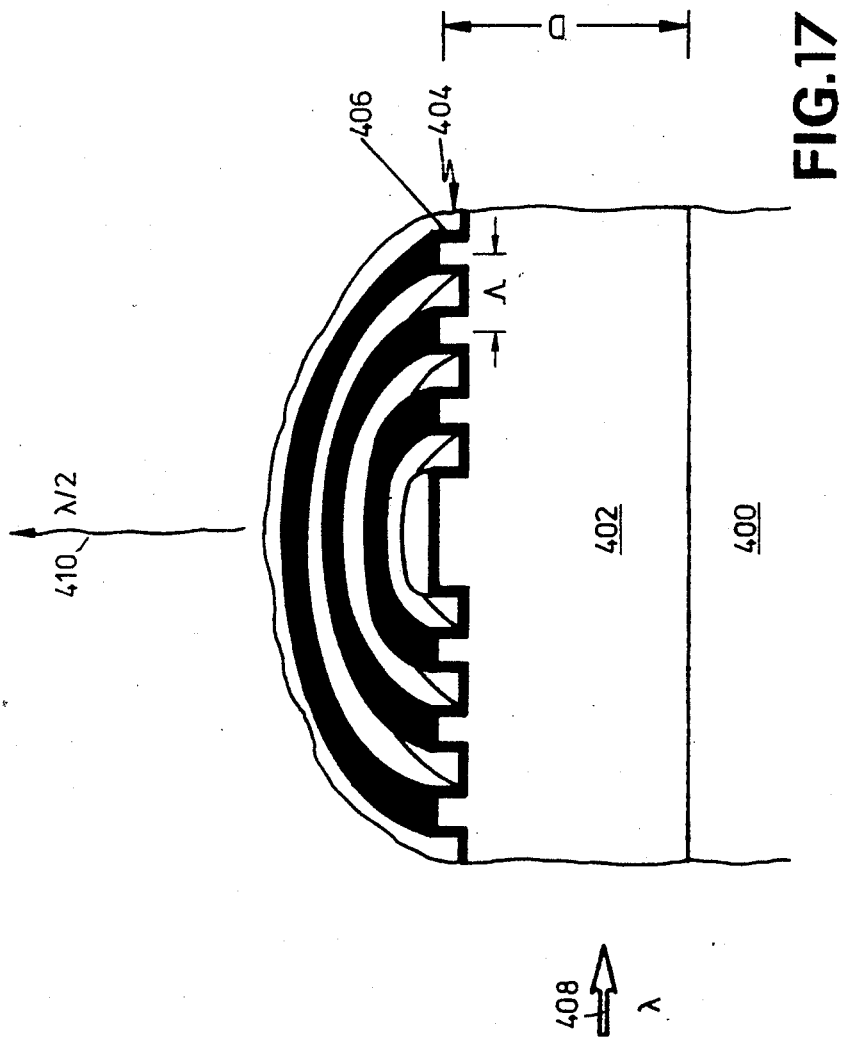

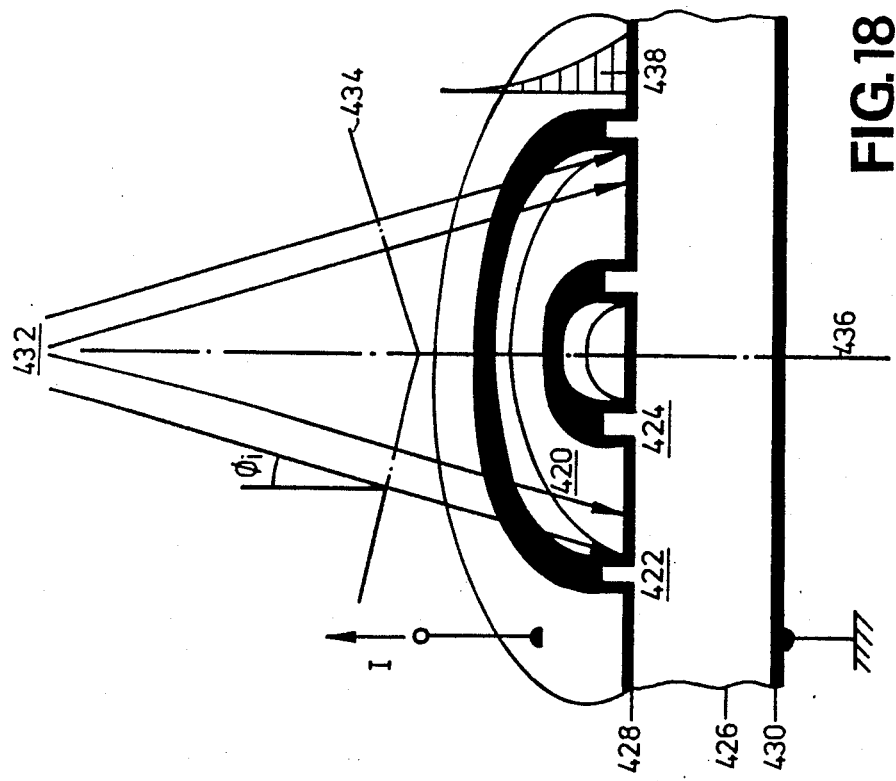

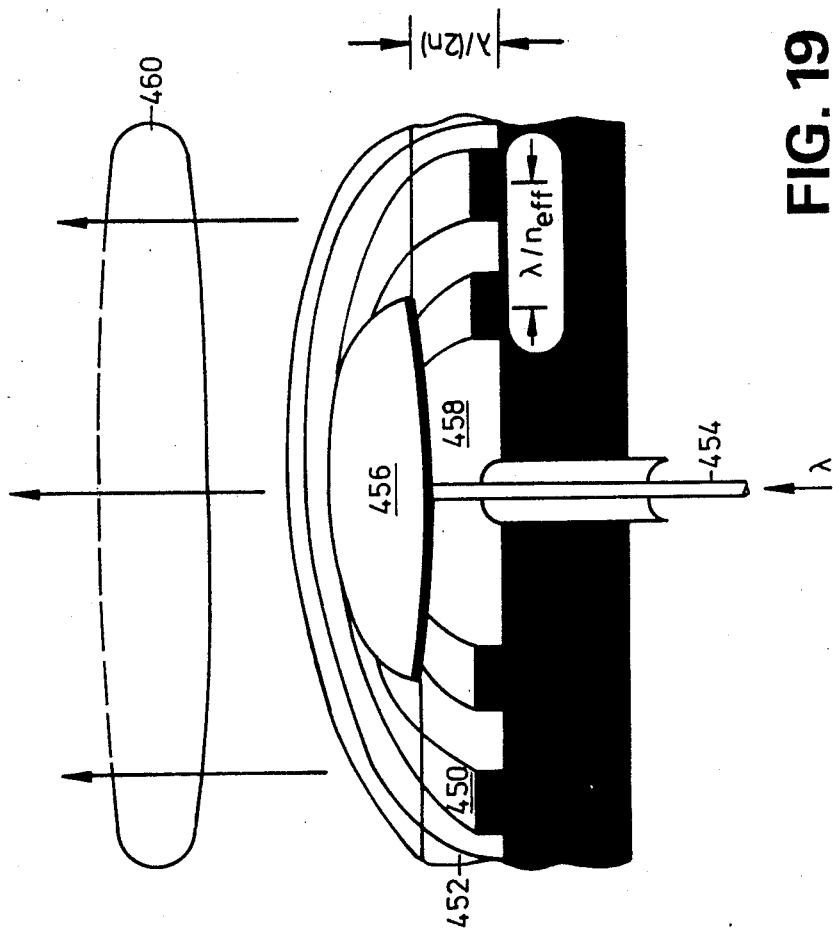

CYLINDRICAL DIFFRACTION GRATING COUPLERS AND DISTRIBUTED FEEDBACK RESONATORS FOR GUIDED WAVE DEVICES

BACKGROUND OF THE INVENTION

1. Field of the Invention

The present invention relates to apparatus (devices) for controlling and guiding waves such as waves of electromagnetic radiation, acoustic waves, pressure waves and the like. This apparatus includes at least one wave-transmitting medium and a diffraction grating, associated with the transmitting medium, for scattering wave energy into or out of the guided waves. The apparatus may take the form a "sandwich"-type or thin film waveguide, in which case the transmitting medium has at least one curvi-planar boundary. The apparatus may also take the form a "rod"-shaped or cylindrical waveguide, in which case the transmitting medium has a substantially cylindrical boundary.

2. Description of the Prior Art

Wavelength and direction-selective diffraction of acoustic or electromagnetic waves is conveniently achieved by an arrangement called a "diffraction grating" or "Bragg reflector". A "diffraction grating" is comprised of a large number of substantially parallel and equidistant "grating lines" which produce controlled scattering of waves. The "grating lines" may be created by variations in relief of a wave-reflecting surface, or by variations in some aspect of a wave-transmitting medium which varies some aspect of the waves propagating within the medium. For example, the lines may be formed by variations in the index of refraction—which determines the velocity of waves within the transmitting medium—or variations in the "gain constant"—i.e., the constant of wave amplification or attenuation—at successive lines or points within the medium.

A one-dimensional grating consists of a plurality of parallel, equidistant and linear grating lines on a transparent or reflecting planar or concave surface. The grating lines may be alternatively more or less absorbing, giving an amplitude grating, or varying in relief or refractive index in an alternating manner, giving a phase grating. A two-dimensional grating may be formed, for example, by a pair of one-dimensional gratings superimposed at a certain angle or by circular or spiral grating lines provided on a planar surface. Three-dimensional diffraction gratings occur naturally, for example in crystals, due to the ordering of molecules along straight lines.

Joseph Fraunhofer is generally regarded as the inventor of diffraction gratings. He described small grating lines on a planar, reflecting surface in 1823, developed their geometrical theory and used them to make surprisingly accurate wavelength calibrations of solar absorption lines.

Today, diffraction gratings are used in a large variety of devices, particularly optical devices. Typical of this large body of prior art are the following references:

(1) U.S. Pat. No. 3,970,959 to Wang et al. entitled "Two Dimensional Distributed Feedback Devices and Lasers", 1976.

(2) U.S. Pat. No. 4,006,432 to Streifer et al. entitled "Integrated Grating Output Coupler in Diode Lasers", 1977.

(3) U.S. Pat. No. 4,140,362 to P. K. Tien entitled "Forming Focusing Diffraction Gratings for Integrated Optics", 1976.

(b 4) J. Dyson, "Circular and Spiral Gratings" *Proc. Royal Soc. London* Ser. A248, pp. 93–106, 1958.

(5) C. V. Shank, and R. V. Schmidt, "Double-Heterostructure GaAs Distributed-Feedback Laser", *Appl. Phys. Lett.* 25, pp. 200–201, 1974.

(6) H. A. Haus, and C. V. Shank, "Antisymmetric Taper of Distributed Feedback Lasers", *IEEE J. Quantum Electron.* QE 12, p. 532, 1976.

(7) R. F. Kazarinov et al., "Planar Distributed-Feedback Optical Resonators", *Sov. Phys. Tech. Phys.* 21, pp. 130–136, 1976.

The U.S. Pat. No. 3,970,959 to Wang et al. teaches the application of a two-dimensional diffraction grating to thin film optical wave guides. These gratings serve to reflect or scatter light waves into controllable transverse modes of propagation. The U.S. Pat. No. 4,006,432 to Streifer et al. utilizes a one-dimensional grating in a heterojunction diode laser to produce a highly collimated, polarized light beam perpendicular to the plane of the PN junction (which is the plane of the thin film waveguide structure). The U.S. Pat. No. 4,140,362 to Tien discloses techniques for producing two-dimensional curved line diffraction gratings on a thin film optical device. The purpose of such gratings is to focus as well as diffract light that is confined to the film—i.e., the "optical waveguide"—in which the grating is formed. Although these grating lines produced by Tien form only a segment of a circle, completely circular and spiral diffraction gratings are also known from the article by Dyson (Ref. 4, above).

Resonators for optical wave lasers have been built by replacing the end mirrors by diffraction gratings, eventually combining them into one grating extending over the entire length of the light-amplifying medium (Ref. 5, above). By properly adjusting the shift of two gratings with respect to each other, single mode operation at one of the Bragg wavelengths of the grating can be achieved (Ref. 6, above). Furthermore, a planar film waveguide containing a one-dimensional grating has been considered as an optical resonator with laser emission at an angle to the plane of the film waveguide (Ref. 7, above).

It is not known, however, to device a diffraction grating within a thin film (curvi-planar) or rod-shaped resonator so as to efficiently couple power out of the resonator. More particularly, it is not known to couple power out of a curvi-planar resonator into an optionally linearly polarized and optionally focussed beam directed substantially vertical to the plane of the resonator. With rod-shaped structures, it is not known to produce standing waves within these structures, thereby to produce a resonator, by means of gratings. It is also not known to effect the efficient coupling of power out of such a resonator with an omni-directional beam having maxima substantially perpendicular to the axis of the resonator.

The application of nonlinear optics to optical waveguides is of great current interest, since the waveguide confines the optical intensity to a small area given by the cross-section of the waveguide and maintains a high optical intensity over a longer propagation distance. It is not known, however, to further concentrate the optical intensity within a waveguide by a diffraction grating. More particularly, it is not known to concentrate in a thin film waveguide optical intensity in the center of a standing wave pattern produced by a cylindrical diffraction grating.

SUMMARY OF THE INVENTION

It is an object of the present invention to provide apparatus for controlling and guiding waves which includes at least one wave-transmitting medium and a diffraction grating for producing standing waves within the wave transmitting medium.

It is a further object of the present invention to provide apparatus of the above-noted type in which the diffraction grating serves to efficiently couple wave energy out of the wave transmitting medium.

These objects, as well as further objects which will become apparent from the discussion that follows, are achieved, according to the present invention, by providing a diffraction grating having a plurality of substantially closed loop grating lines consecutively enclosing each other from inner to outer, with all of the grating lines extending substantially parallel to the phase fronts of the guided waves.

More particularly, the "sandwich" type structure for controlling waves according to the invention includes a waveguide configured to confine and guide propagating waves and comprising at least one wave-transmitting medium having a curvi-planar boundary and a diffraction grating for scattering wave energy into or out of the guided waves. The diffraction grating includes a large number of substantially closed loop grating lines consecutively enclosing each other from inner to outer. All of these grating lines extend substantially parallel to the wave phase fronts of the guided wave.

The "rod"-shaped structure for controlling waves according to the invention comprises a wave-transmitting medium having a substantially cylindrical boundary and means, such as mirrors or a diffraction grating, for reflecting waves back and forth in the axial direction within this medium. A separate diffraction grating is disposed on the cylindrical boundary for diffracting power into our out of the counter-propagating waves forming the standing waves. This grating comprises a large number of substantially closed loop grooves, which extend along the cylindrical boundary in planes parallel to the phase fronts of the guided waves.

As used throughout this specification, the term "cylindrical" is employed in its general mathematical sense to denote a shape having the form or properties of a "cylinder". *Webster's Collegiate Dictionary* defines a cylinder as "the surface traced by a straight line moving parallel to a fixed straight line and intersecting a fixed curve". This fixed curve is normally a closed loop of arbitrary shape, so that the cylinder is formed by a closed loop surface which is parallel at every point to a fixed straight line.

For a full understanding of the present invention, reference should now be made to the following detailed description of the theoretical underpinnings as well as the preferred embodiments of the invention, as well as to the accompanying drawings.

BRIEF DESCRIPTION OF THE DRAWINGS

FIG. 2A is a longitudinal cross-sectional and partly representational diagram of a generalized "rod"-shaped or cylindrical waveguide having a diffraction grating according to the invention, for coupling wave energy out of the device and for back reflection of wave energy.

FIG. 4A is a diagram of the magnetic field component H and the electric field component $E_\phi$ with respect to the radius r in the device of FIG. 1.

FIG. 4B is a representational diagram of the diffraction grating in the device of FIG. 1 illustrating how the grating lines are "fine tuned" with the magnetic and electric field components.

FIG. 6 is a representational diagram of a section of a diffraction grating, illustrating how such a grating serves to couple energy out of a device of the type shown in FIG. 1.

FIG. 7 is a diagram similar to FIG. 6, illustrating how energy is coupled out into a focussed beam.

FIG. 8 is a representational diagram of a single grating line in the device of FIG. 1 illustrating how waves coupled out of the waveguide in FIG. 1 in opposite directions are caused to reinforce each other.

FIG. 12A is a cross-sectional diagram illustrating the active portion of a diode laser employing a diffraction grating according to the present invention for providing back reflection and for coupling energy out of a laser in vertical beams.

FIG. 12B is a plan view of the diffraction grating employed in the laser diode of FIG. 12A.

FIG. 16B is a plan view of the diffraction grating employed in the laser diode of FIG. 16A.

FIG. 17 is a cross-sectional and partly representational diagram of a waveguide structure capable of second harmonic generation from a fundamental pump wave which uses a diffraction grating according to the invention to produce linearly polarized waves.

FIG. 18 is a cross-sectional and partly representational diagram showing a photodetector employing a diffraction grating according to the invention.

FIG. 19 is a cross-sectional and partly representational diagram showing a planar microwave antenna employing a diffraction grating according to the invention.

DESCRIPTION OF THE PREFERRED EMBODIMENTS

Figure 1A:
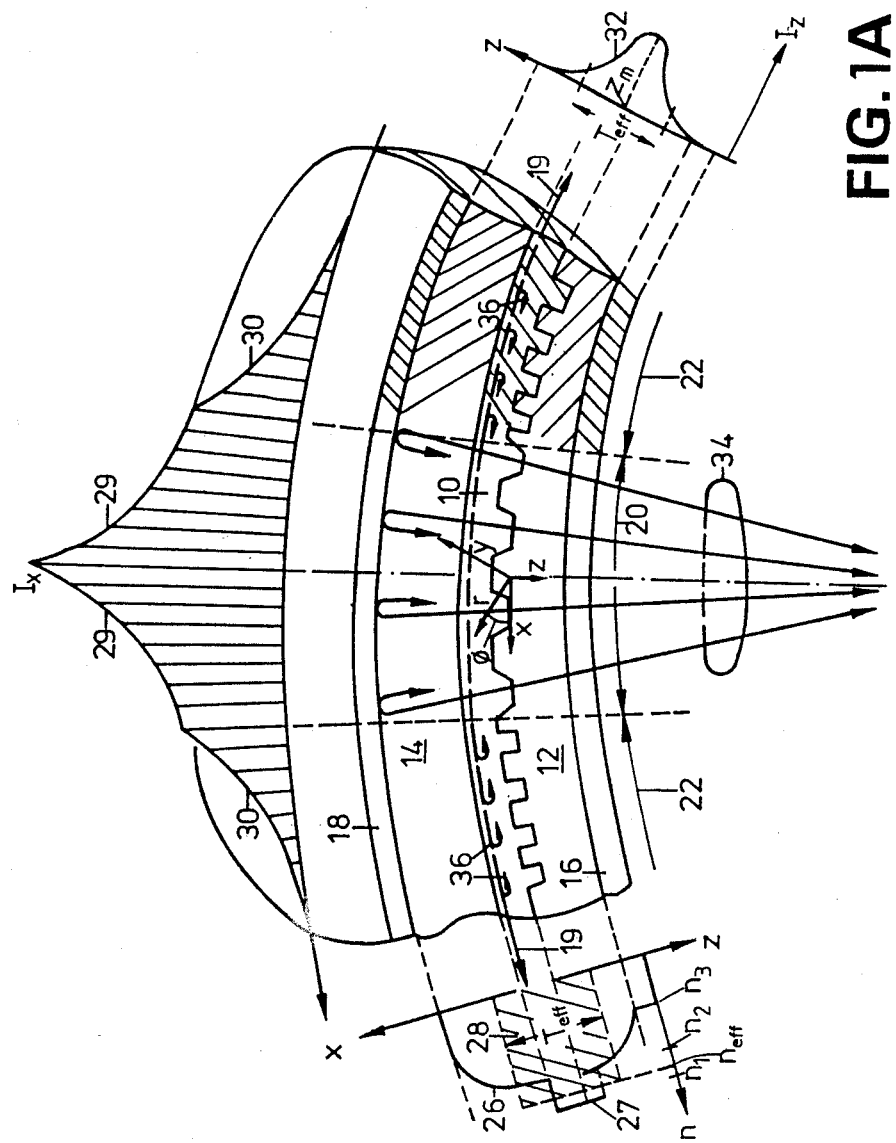
FIG. 1A is a cross-sectional and partly representational diagram of a generalized "sandwich"-type or thin film waveguide, having a diffraction grating according to the invention, for controlling electromagnetic waves.
Figure 2B:
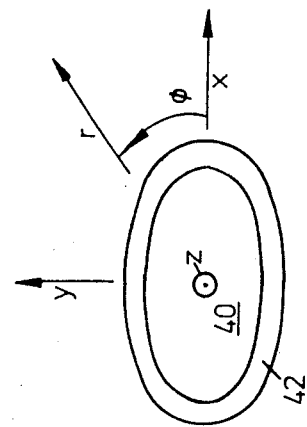
FIG. 2B is an axial cross-sectional view of the rod-shaped structure of FIG. 2A.

Both the theoretical background as well as exemplary applications of the present invention will now be described with reference to FIGS. 1–20 of the drawings. Identical elements in the various figures are designated by the same reference numerals.

General Waveguide Configuration: FIGS. 1A and 1B and FIGS. 2A and 2B illustrate waveguides of curvi-planar and curvi-linear cylindrical shape, respectively, which are provided with diffraction gratings in accordance with the principles of the present invention. In both of these diagrams, the x, y and z Cartesian coordinates and the r and $\phi$ polar coordinates are indicated to provide orientation. The waveguide of FIGS. 1A and 1B has a "sandwich" structure which is slightly curved (i.e., spherical) in the x-y direction. The waveguide of FIGS. 2A and 2B has a "rod" shape which exhibits a slight curve along its central (z) axis. Both of these configurations would be exactly "cylindrical" if the waveguide had no curvature. The slight deviation from a plane in the sandwich structure (FIGS. 1A and 1B) and the slight axial curvature in the rod structure (FIGS. 2A and 2B) can be treated as a small disturbance of the cylindrical configuration and, therefore, in the first approximation, it can be ignored.

Figure 1B:
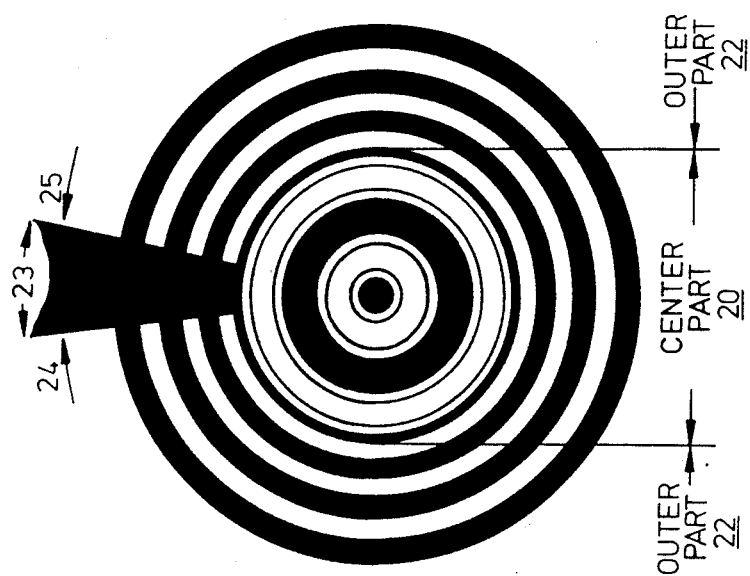
FIG. 1B is a plan view of the diffraction grating employed in the device of FIG. 1A.

Considering first the waveguide of FIGS. 1A and 1B (hereinafter referred to as "FIG. 1") there is shown a cross-section of the sandwich structure comprising a central wave transmitting layer 10, two wave transmitting "cladding" layers 12 and 14, an anti-reflection layer 16 and a reflective or mirror layer 18. The index of refraction $n_1$ of the central layer is higher than the indices of refraction $n_2$ and $n_3$ of the cladding layers 12 and 14, respectively. The central and cladding layers thus serve as a waveguide for electromagnetic radiation (EMR) in the infrared, visible light or ultraviolet light spectra. The transmission of such radiation along the waveguide is indicated by the arrows 19.

The boundary between the central layer 10 and the cladding layer 12 includes a plurality of substantially closed loop ridges and grooves which form a diffraction grating. The dimensions of these ridges and grooves will be discussed later. Suffice it to say at this point that they are in the order of the wavelength of the electromagnetic radiation transmitted in the waveguide.

FIG. 1B shows the diffraction grating in plan view, with the bottoms of the grooves (i.e., the surfaces of the cladding layer 12 facing the central layer 10 which are closest to the cladding layer 14) indicated in solid black. As may be seen, the grooves are substantially circular and coaxial; i.e., they successively enclose each other from the innermost groove outward.

As may be seen in both FIG. 1A and FIG. 1B, the diffraction grating is divided into two parts: a center part 20 and a surrounding, outer part 22. The widths of both the ridges and grooves in the center part are larger than those of the outer part. The grooves in the center part are trapezoidal-shaped in cross section, whereas the grooves in the outer part have a rectangular cross section. It can be seen in FIG. 1B that the grating lines of the outer part 22 are interrupted in a sector shaped region 23, which means that the region 23 is uncorrugated. The region 23 is bound two lines 24 and 25, which run perpendicular to the ridges and grooves.

Surrounding FIG. 1A are graphs of the index of refraction, n(z) of the waveguide layers; the intensity distribution $I_x$, along the x axis within the central layer 10 of the waveguide; and the axial intensity distribution $I_z$, at the center of the grating.

Considering first the graph at the left-hand portion of FIG. 1A, it is seen that the refractive index n varies along the z axis as indicated by the characteristic 26. The characteristic 26 reaches a maximum equal to the refractive index $n_1$ along the portion of the z axis containing the central layer 10, and falls off in the cladding layers 12 and 14 which have indices of refraction $n_2$ and $n_3$, respectively. In the region 27 along the z axis of the diffraction grating, the index n depends upon the respective widths of the ridges and grooves of the grating. The shaded rectangle 28 has a length along the z axis equal to the effective width $T_{eff}$ of the axial intensity distribution $I_z$ and a height along the n axis equal to the effective refractive index $n_{eff}$ of the waveguide. The quantities $T_{eff}$ and $n_{eff}$ will be defined further below.

The graph in the upper portion of FIG. 1A shows that the intensity distribution falls off toward the outside of the grating as indicated by the characteristics 29 and 30. For reasons which will be explained hereinbelow, the center part 20 of the diffraction grating couples EMR out of the waveguide. This causes the exponential decrease according to the curves 29. In the region of the outer part 22 of the diffraction grating, the EMR is back reflected toward the center of the grating. This causes an even more abrupt exponential decrease of the intensity as indicated by the curves 30.

The axial distribution of the intensity within the waveguide formed by the sandwich structure is indicated by the graph at the right-hand portion of FIG. 1A. Shown in this graph is the intensity distribution of electromagnetic radiation for the fundamental mode within the waveguide as a function of position along the z axis. As indicated by the curve 32, the intensity reaches a maximum within the central layer 10 of the waveguide at the axial position $z=z_m$ and falls off sharply in the cladding layers 12 and 14. The width of the intensity curve 32 along the z axis at which the intensity falls to one tenth of the maximum is designated by the value $T_{eff}$.

Shown within the sandwich structure of FIG. 1A are bidirectional rays 34, directed perpendicular to the plane of the waveguide, and rays 36 which are reflected back by the grating in the plane of the waveguide. The rays 34 which are emitted in the negative direction of the z axis are reflected by the mirror layer 18 in the opposite direction. These rays, together with the rays that are emitted in the positive direction of the z axis, pass out of the waveguide through the anti-reflection layer 16 into free space. Because of the spherical curvature of the waveguide structure, the bundle of rays 34 is focused at a point (not shown) along the z axis. If the sandwich structure of FIG. 1A were completely planar in the x and y directions, the rays 34 would be substantially parallel.

Considering now the complementary waveguide structure in FIG. 2, there is shown a rod-shaped waveguide made of wave transmitting core material 40 having an index of refraction $n_4$. The core 40 is surrounded by air or vacuum, which acts as a cladding layer. Etched into the outer circumference are a plurality of ridges and grooves 42 forming a diffraction grating. These ridges (grooves) are coaxial and extend in planes perpendicular to the rod axis (z axis). As in the case of the sandwich structure shown in FIG. 1, the grooves are arranged in three parts: a center part 44 and outer parts 46. Within the center part 44, the grooves (ridges) are equally spaced, and within the outer parts 46 the grooves (ridges) are equally spaced. The spacing of the grooves in the center part is designed to couple EMR energy out of the waveguide, whereas the spacing of the grooves in the outer part is designed to couple wave energy travelling in the z axis direction backward.

As in the case of FIG. 1A, FIG. 2A shows at opposite ends of the rod-like structure and along its upper side, graphs of (1) the refractive index, (2) the distribution of intensity within the waveguide in the z direction, and (3) the distribution of intensity within the waveguide along the radius r (or, in this case, the x axis).

Since the wave transmitting medium of the waveguide is made of one type of material only, the refractive index is equal to $n_4$ across the cross section of the rod and falls abruptly to the vacuum index outside as indicated by the curve 48. Only in the areas 50 of the grating, where the waveguide material is interrupted by air or vacuum, n depends upon the respective widths of the ridges and grooves of the grating. The shaded rectangle 51 illustrates again the quantities $T_{eff}$ and $n_{eff}$ as defined further below.

The curves 52 of the intensity in the region of the center part 44 of the diffraction grating and the curves 54 in the regions of the outer parts 46 of the grating are exponentials, and are essentially identical to the corresponding curves 29 and 30 for the sandwich structure of FIG. 1.

Similarly, the curve 56 shows the intensity distribution along the x axis for the fundamental mode of the rod-like waveguide and has indicated the width $T_{eff}$ of the intensity distribution. In this case, the intensity distribution extends into the air, which acts as a cladding layer.

Theoretical Explanation: Given a planar waveguide with a cylindrical diffraction grating—i.e., a diffraction grating formed of closed loop grating lines, each defining a separate cylinder—or given a cylindrical waveguide with an axial diffraction grating—i.e., a diffraction grating formed of closed loop grating lines, each extending in planes perpendicular to the cylinder axis—each of these two arrangements can support an EMR wave with a cylindrical field distribution. This means that we may consider both the grating-waveguide configuration and the distribution of the electromagnetic field within the waveguide to be cylindrical, also.

In considering the field distribution in such a cylindrical grating-waveguide configuration, it is useful first to consider the equations for the field distribution with circular cylinder symmetry. The generalization to a cylindrical field distribution is straightforward, essentially by linear superposition of two or more phase coupled circular cylindrical fields with parallel shifted axes (Huygen's principle). Such a generalization will be explained below in greater detail.

Figure 3:
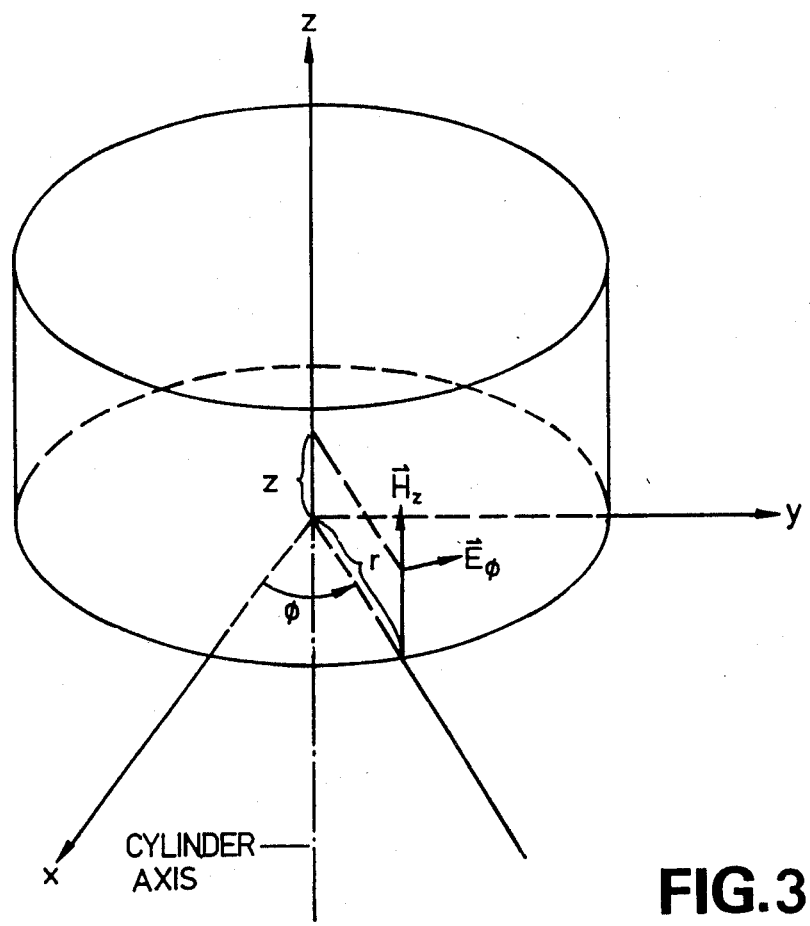
FIG. 3 is a coordinate diagram showing cylindrical coordinates superimposed on Cartesian coordinates.

To define the field distribution with circular cylinder symmetry, we use the polar coordinates r, $\phi$ and z of a circular cylinder. FIG. 3 illustrates this coordinate system in which the z axis coincides with the cylinder axis, r is the distance of a point from the cylinder axis and $\phi$ is the angular position of the point. Also shown is the field vector $\overline{H}_z$ of the axial directed magnetic field and the field vector $\overline{E}_\phi$ of the circumferentially directed electric field.

We first consider a monochromatic guided wave. Multiple wavelength operation can also be obtained essentially by superimposing waves of different free space wavelengths such that they are guided by the waveguide and are interacting with the grating. Eventually, a definite amplitude or phase relation between these waves can be maintained, which is useful for wave modulation, mode locking or wave mixing.

For a monochromatic field of circular cylinder symmetry, the axial directed electric field $E_z$ and the axial directed magnetic field $H_z$ can be considered as the generating field components of the total electromagnetic field, which means that all other field components can be derived from $E_z$ and $H_z$. Maxwell's equations for these axial field components can be separated into two sets of scalar wave equations:

$$(\partial^2/\partial z^2 + K_z^2)\begin{Bmatrix} E_z \\ H_z \end{Bmatrix} = 0 \tag{1}$$

$$\left[\frac{1}{r}\frac{\partial}{\partial r}\left(r\frac{\partial}{\partial t}\right) + \frac{1}{r^2}\frac{\partial^2}{\partial \phi^2} + K_r^2\right]\begin{Bmatrix} E_z \\ H_z \end{Bmatrix} = 0 \tag{2}$$

where $K_z$ and $K_r$, the axial and radial propagation constants, respectively, are related via the equation:

$$K_z^2 + K_r^2 = (2\pi n/\lambda)^2. \tag{3}$$

These constants $K_z$ and $K_r$ will be further specified below. In equation (3), n is the refractive index of the waveguide layer at the point where the field is evaluated. The equation (1) describes the z dependence of the axial field components and the equation (2) describes the r, $\phi$ dependence of the axial field components.

For the sandwich structure in FIG. 1, it is essentially equation (1) which describes the standing wave patterns in the axial direction of the waveguide modes and it is essentially equation (2) which describes the wave propagation in the radial direction. The action of the rod shaped structure in FIG. 2 can be treated in a manner similar to that of the sandwich structure of FIG. 1 by interchanging the role of the equations (1) and (2). In this case it is essentially equation (2) which describes the standing wave patterns due to waveguiding in the radial direction and it is essentially equation (1) which describes the wave propagation in the axial direction for the arrangement in FIG. 2.

The wave action within the structure of FIG. 1 will now be described in detail. For definiteness, the guided wave in the waveguide structure of FIG. 1 is considered to be monochromatic with the free space wavelength $\lambda$ and to be confined to a single waveguide mode, which has only the axial magnetic field $H_z$ as generating field component ($E_z \equiv 0$). The solution of equation (1) for each waveguide layer yields the z-dependence of the axial magnetic field $H_z$ and therefrom derived the z-dependence of the circumferential electric field $E_\phi \alpha \partial H_z / \partial r$.

The z-dependence of the intensity distribution $I_z \alpha E_\phi^2$ is illustrated on the righthand side of FIG. 1A. The intensity extends over the axial distance $T_{eff}$, which is shown in FIG. 1A. $T_{eff}$ is denoted as the effective thickness of the waveguide. The solution of equation (1) yields via equation (3) also the radial propagation constant $$K_r = 2\pi n_{eff}/\lambda. \quad (4)$$

In equation (4), $n_{eff}$ is the effective refractive index of the waveguide, which can be interpreted as a field-weighted average of the indices of refraction of the different waveguide layers. The quantities n and T characterize an effective dielectric waveguide, which will be used for the description of the action of the grating-waveguide configuration. The concept of the effective dielectric waveguide encounters a wide class of waveguides. The model is particularly useful for the description of a waveguide with a graded refractive index as shown in FIG. 1 or of a multilayer waveguide such as a multiple quantum well waveguide. It is noted that the model also applies to a waveguide with one or several metal boundaries such as a metal hollow waveguide.

The superposition of a guided wave with circular phase fronts outgoing from the cylinder axis, and a guided wave incoming toward the cylinder axis, forms a circular cylindrical standing wave pattern, which is described by equation (2). The standing wave solutions of equation (2) for the axial magnetic field $H_z$ and the solution for the circumferentially directed electric field $E_\phi$, derived therefrom, are well known to be given by the linear superposition $$H_z(r,\phi) = \sum_m h_m \cos(m\phi) J_m(K_r r), \quad (5)$$

$$E_\phi(r,\phi) = \sum_m e_m \cos(m\phi) J_m'(K_r r). \quad (6)$$

$J_m$ denotes the cylinder function (Bessel function) of the first kind of the integer order $m = 0, 1, \ldots$, and $J_m'$ denotes the derivative of $J_m$ with respect to the argument $K_r r$.

As an example, the Bessel function $J_1$ and its derivative $J_1'$ are illustrated in FIG. 4A as a function of the radius r, for a range of small radii and for a range of larger radii, respectively. In this Figure, the vertical scale in the left-hand portion of the diagram is smaller than the vertical scale in the right-hand portion. Nevertheless, the magnitude of the functions $J_1$ and $J_1'$ is greater near the left-hand (z) axis than toward the right.

According to the equations (5) and (6), the standing wave pattern corresponding to a pair of coefficients $h_m$ and $e_m$ is characterized, in particular, by its number of radial directed nodal lines, along which the cosine function, and therefore $H_z$ and $E_\phi$ vanish. The standing wave pattern corresponding to a pair of coefficients $h_m$ and $e_m$ is usually denoted as the mode of the circumferential order m.

Figure 5A:
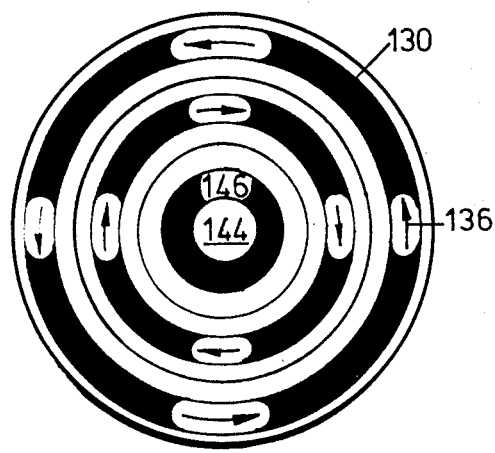
FIGS. 5A, 5B and 5C are plan views illustrating different standing wave modes and nodal lines in the device of FIG. 1.
Figure 5B:
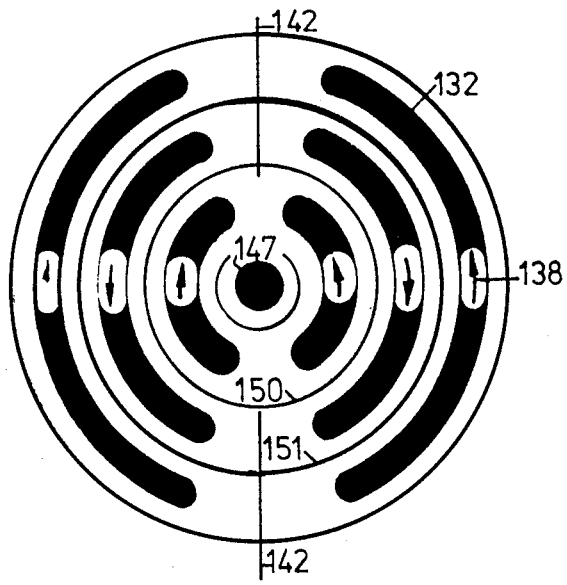
Figure 5C:
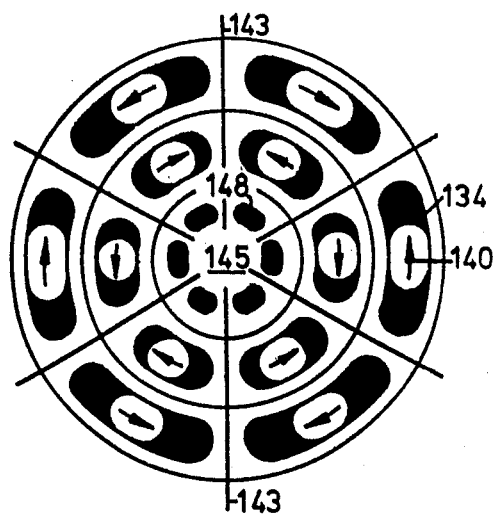

The r, $\phi$ dependence of field intensity $E_{100}^2$ is illustrated in FIGS. 5A, 5B and 5C by the shaded areas 130, 132 and 134, respectively, for the mode of the circumferential order $m = 0$, 1 and 3, respectively. Since $E_{100}$ is the electric field component of a standing wave, the shaded areas illustrate pockets of stored wave energy. The arrows 136, 138 and 140 within the energy pockets illustrate the direction of the electric field. Generally, the circumferentially oriented field is symmetric (antisymmetric) with respect to the field center for modes with odd (even) integer order m, as illustrated by the arrows 136, 138 and 140.

Radial directed nodal lines 142 and 143 are also shown. In FIGS. 5A and 5C, a field free area 144 and 145 in the center of the standing wave pattern can be seen. The radius of this field free area extends with increasing mode order m, as prescribed by the functions $J_m'$. It is noted that radially consecutive energy pockets contain essentially equal amounts of energy. Since the circumferential length of the pockets linearly decreases with decreasing radius r, the volume energy density increases with decreasing radius. The most inner energy pockets illustrated by the areas 146, 147 and 148 are therefore the energy pockets with the highest energy density for the mode with $m = 0$, 1 and 3, respectively. This concentration of wave energy in the center of the standing wave pattern cannot be achieved with state of the art sandwich type waveguides containing a grating (nor with the resonator according to FIG. 2). This "piling" of wave energy is most pronounced for modes with a low circumferential order m.

Having a waveguide according to FIG. 1 provided with a nonlinear material (for example $LiNbO_3$, ZnS or a nonlinear organic material), for example in the cladding layer 12 or the central layer 10, the cylindrical grating in the waveguide is a promising arrangement to enhance nonlinear interactions. This attractive feature of the arrangement in FIG. 1 can be used for frequency conversion (via second order nonlinearities) or for affecting the z dependence of the field distribution by intensity-induced refractive index changes (using third order nonlinearities).

Given a waveguide according to FIG. 1 with an electro-absorptive material (for example GaAs, $Al_{p^-}Ga_{1-p}As$, InP, $Ga_pIn_{1-p} As_pP_{1-p}$ in the central layer 10 or in a cladding layer 12 or 14, the absorption of resonator modes can be influenced by applying an electric field perpendicular to the layers. Such an electric field can be built up by reverse biasing a pn-junction formed by two of the mentioned semiconductor materials. The influence of this electric field will be particularly high, if it is applied in the area around the center of the grating. The influence of the electric field is different for waveguide modes which have $E_z$ as the generating axial field component than for the waveguide modes which have $H_z$ as the generating axial field component. It is therefore possible to select the polarization of the waveguide mode by changing the strength of the applied electric field. As a consequence, different polarization characteristics of the emitted beam 34 can be achieved. Since changes in absorption are accompanied by changes of the refractive index in these materials, the free space wavelength $\lambda$ of the resonator modes can be influenced. The absorbed radiation generates electrical carriers which can be collected by external contacts (not shown in FIG. 1).

With reference to the equation (6), the wavelength $\lambda_m$ of the guided wave in the mode of the circumferential order m is now defined as twice the radial distance between two neighboring circumferential nodal lines 150 and 151 of the electric field component $E_\phi$. The circumferential nodal lines 150 and 151 are illustrated in FIG. 5B. This means that the difference of two consecutive zeros of the function $J_m'$ is used as a measure for the length of the guided wave. For sufficiently large r, the functions $J_m$ and $J_m'$ follow essentially the trigonometric functions:

$$J_m(K_r r) \to \sqrt{2/(\pi K_r r)} \cos(K_r r - m\cdot\pi/2 - \pi/4) \qquad (7)$$

$$J_m'(\pi K_r r) \to -\sqrt{2/(\pi K_r r)} \sin(K_r r - m\cdot\pi/2 - \pi/4) \qquad (8)$$

which have the zeros equally spaced. For larger values of r, the wavelength of the guided wave is therefore essentially given by $$\lambda_m \approx \lambda/n_{eff}, \qquad (9)$$

which would be equal to the wavelength of a guided wave with plane wave fronts. Only in the very center of the standing wave pattern of the mode of order m, the wavelength $\lambda_m$ becomes noticably larger than the length given by equation (9). As an example, FIG. 4A shows the wavelength $\lambda_1$, in the range of small radii, where the wavelength $\lambda_1$, slightly varies with r and in the range of larger radii, where the wavelength $\lambda_1$ is essentially constant.

The action of the grating on a guided wave will now be described in greater detail. To efficiently extract power from a guided wave with circular cylindrical phase fronts by means of a grating, it is useful to have the ridges and grooves of the grating arranged in concentric circles. The ridges extend then perpendicular to the direction of propagation of the wave or, equivalently, parallel to the phase fronts of the wave.

As a first approximation, the effect of the grating on the waveguide properties can be modelled by relating the changes of the position of the boundary containing the grating to changes of the effective thickness $T_{eff}$ and of the effective refractive index $n_{eff}$ of the waveguide. FIG. 4B shows schematically the radial variation of the effective thickness of the waveguide along the x axis due to the ridges of the waveguide structure in FIG. 1. The radial variation of the effective refractive index is illustrated by the more or less shaded areas within the center part 152 and the outer part 153 of the effective dielectric waveguide. Qualitatively speaking, with reference to FIG. 1 and FIG. 4B, if the guided wave is highly confined to the higher refractive index layers of the guide by increasing the thickness of the central layer, the effective refractive index is higher. Additionally, the ray 154, which runs through the position of the maxima of consecutive axial intensity distributions 156 and 157, is bent toward the side of the ridge. Also, the effective thickness of the guide decreases. Each ridge in the central layer in FIG. 1A therefore corresponds to an effective boundary displacement 160 on the opposite side in the effective dielectric waveguide and to a region of higher effective refractive index in FIG. 4B.

The effect of the grating on an outgoing wave will now be described, beginning with the grating of the center part of FIG. 1. FIG. 6 shows a magnified portion of the center part of the effective dielectric waveguide structure. In FIG. 6 the sides of each effective boundary displacement 160, 161 or 162 are two regions 164 and 165 with a change $\Delta T_{eff}$ of the thickness and a change $\Delta n_{eff}$ of the effective refractive index along the ray 154. Each effective boundary displacement has an average radial width W. Neighboring boundary displacements 160 and 161 are the radial distance $\Lambda$ apart.

The electric field vector $\vec{E}_\phi$ out of the outgoing wave in the presence of a waveguide inhomogeneity in the region 164 is thought to cause a scattered wave with a magnetic field vector $\vec{H}_{rad}$ and an electric field vector $\vec{E}_{rad}$. The scattered wave propagates in the direction of the ray 166.

The range of angles $\theta$, in which scattering occurs is relatively large, as illustrated by the phase front 168, due to the small extension of the waveguide inhomogeneity in region 164 of the order or smaller than the wavelength $\lambda_m$.

With reference to FIG. 6, the widening (narrowing) of the guide in the region 164 (165) causes a bending of the ray 154 toward greater (smaller) values of the z-coordinate and a diffraction of radiation in the direction of the ray 170 (172), which is preferentially oriented toward increasing r-values.

The increasing (decreasing) effective refractive index in the region 164 (165) causes a reflection of radiation in the direction of the ray 174 (176), which is preferentially oriented toward decreasing r-values.

We now considered diffraction out of the waveguide in the direction of increasing z-values, which comes mainly from regions corresponding to region 164, where the ray 154 is bent toward increasing z-values.

The superposition of the rays 178 and 179 diffracted from two neighboring regions 180 and 181 corresponding to the region 164 yields a condition for the angles $\theta_c$ of emission of the grating due to multiple constructive interference. Mathematically expressed the rays 178 and 179 are in phase, if $$\Lambda - B = j\lambda_m \qquad (10)$$

where $\lambda_m$ and $\lambda$ are noted, j is an integer and B is the distance shown in FIG. 6 along the ray 178 from the ray 154 at the center of the region 180 to the wavefront that passes through the center of the region 181.

Since from FIG. 6

$$B = \Lambda \cos\theta_c, \qquad (11)$$

equation (10) and equation (11) yield $$\cos\theta_c = 1 - j\lambda_m/\Lambda. \qquad (12)$$

By varying the radial spacing $\Lambda$ of the boundary displacements, a broad range of angles $\theta_c$ can be achieved.

Of particular interest is emission of the grating at the angle $\theta_c = \pm\pi/2$ radians, which is vertical emission out of the waveguide plane. According to equation (12) it is necessary to have $\Lambda = j\lambda_m$, which means that the spacing $\Lambda$ between the boundary displacements is equal to the wavelength in the guide at the position of the boundary displacement, or an integer multiple thereof.

The emission out of the waveguide can be enhanced, if scattering of power from the outgoing to the incoming wave is cancelled by destructive interference. The two rays 174 and 176 would be out of phase, if $$2W/\lambda_m + (\Delta\phi_2 - \Delta\phi_1)/(2\pi) = k + \tfrac{1}{2}, \qquad (13)$$

where W and $\lambda_m$ are noted, k is an integer and $\Delta\phi_1$ and $\Delta\phi_2$ are the phase changes of the rays 174 and 176, respectively, after scattering in the regions 164 and 165 due to changes of the effective refractive index, respectively.

For a width W much smaller than $\lambda_m$, there should be no back scattering. In order to satisfy equation (13) for this case, $\Delta\phi_2 - \Delta\phi_1$ must be equal to $(2k+1)\cdot\pi$ radians, or without loss of generality, $\Delta\phi_2 - \Delta\phi_1 = \pi$ radians.

According to equation (13) the back scattering of power is cancelled if $$W = k \cdot \lambda_m / 2, \qquad (14)$$

which means that the width W of the boundary displacement is equal to one half of the wavelength in the guide or an integer multiple thereof.

For the central portion of the grating of the waveguide in FIG. 1, the radial spacing $\Lambda$ is chosen to be equal to $\lambda_1$, and the radial width W is chosen to be equal to $\lambda_1/2$ so that the coupling of power of an outgoing guided wave with the wavelength $\lambda_1$ into a vertical directed beam is maximized.

Also of particular interest is the emission of a grating at an angle $\theta_c = \pm\pi$ radians, which is reflection of the outgoing guided wave into the incoming guided wave, thereby producing a standing wave. Then it follows from equation (12)

$$\Lambda = j \cdot \lambda_m / 2, \qquad (15)$$

which means that the spacing $\Lambda$ between the boundary displacements is equal to one half of the wavelength in the guide at the position of the boundary displacement or an integer multiple thereof. Each wavelength, which satisfies the equation (15) is called a Bragg wavelength of the grating. A grating, which satisfies $\Lambda = \lambda_m/2$ is called a first order grating, and a grating which satisfies $\Lambda = \lambda_m$ is called a second order grating, in particular. FIG. 4B shows the rays 190 and 191 back scattered due to changes of the effective refractive index in the regions 192 and 193, respectively.

The two rays 190 and 191 would be in phase, if $$2W/\lambda_m + (\Delta\phi_2 - \Delta\phi_1)/(2\pi) = \rho, \qquad (16)$$

where $\Delta\phi_2 - \Delta\phi_1 = \pi$, as noted above, and $\rho$ is an integer. Equation (16) solved for W yields $$W = (2\rho - 1) \cdot \lambda_m / 4. \qquad (17)$$

Equation (17) means that the back reflection of the outgoing wave can be made particularly efficient, if the radial width of the boundary displacements is equal to a quarter wavelength in the guide or an odd integer multiple thereof. For the grating in the outer part, the radial distance $\Lambda$ is chosen equal to $\lambda_1/2$ and the radial width W is chosen equal to $\lambda_1/4$, as to maximize the reflection of an outgoing guided wave with the wavelength $\lambda_1$ into an incoming guided wave.

It has been shown in conjunction with FIG. 4B that, in the vicinity of the Bragg wavelengths defined by equation (15), an outgoing guided wave is accompanied by an incoming guided wave, thereby causing a standing wave pattern. The incoming guided wave will superimpose on the primary outgoing wave after a round trip in the grating-waveguide configuration. The optical path length of the round trip, measured in units of the wavelength in the guide, is different for each mode, due to the different wavelengths $\lambda_m$ for small radii, as discussed in conjunction with the equations (6) and (9). In order to achieve constructive interference of the primary wave and the wave having undergone the round trip for a mode of the circumferential order m, the position of the boundary displacements has to be "fine tuned" with respect to the phase fronts of the standing wave pattern of this mode. With reference to FIGS. 4A and 4B, the waveguide inhomogeneities corresponding to the region 193, which produce a drop of the effective refractive index along the ray 154, have to be placed at the loci of maximum absolute values of the electric field $E_\phi$, as illustrated in the right-hand portion of FIGS. 4A and 4B for the mode with m=1. The waveguide inhomogeneities corresponding to the region 192, which produce an increase of the effective refractive index along the ray 154, have to be placed at the loci of the maximum absolute values of the magnetic field $H_z$.

If the position of the boundary displacements of the outer part 153 is radially fine tuned in this way, each grating line extracts power from the outgoing ray 154 and couples it in phase to the incoming ray. The amount of wave energy stored in the rings of wave energy pockets 132 illustrated in FIG. 5 decreases then exponentially with increasing radius. The exponential decrease of the radial intensity is illustrated by the curves 30 in FIG. 1A. By making the radius of the outer grating sufficiently large, essentially all of the standing wave energy is trapped radially. For the arrangement of FIG. 1, the coupling of a guided wave into a beam emitted out of the waveguide then becomes the dominant radiation loss. This means that the coupling of the guided wave to a beam is made highly efficient, to the extent that residual waveguide losses are sufficiently small.

The emission of the grating of the inner part 20 of FIG. 1, in the presence of the standing wave pattern produced by the grating of the outer part 22, will now be explained. For definiteness, vertical emission is considered, beginning with the scattering of power by a single boundary displacement 160.

With reference to FIG. 6, the ray 200 of an incoming guided wave is bent toward increasing z-values in the region 202. The superposition of the rays 178 and 204 diffracted from the region 180 due to the outgoing ray 154 and from the region 202 due to the incoming ray 200, respectively, yields a condition for the radial position of the boundary displacement 160 with respect to the standing wave pattern of the circumferential mode considered.

Mathematically expressed, vertical rays 178 and 204 are in phase, if $$\phi_{out}(r+W) - \phi_{in}(r) = 2\pi i, \qquad (18)$$

where the width W of the boundary displacement 160 is noted, i is an integer and $\phi_{out}$ and $\phi_{in}$ are the phase of the outgoing ray 154 at the center of the region 180 and the phase of the incoming ray 200 at the center of the region 202, respectively.

The rays 154 and 200 of the counter propagating waves are in phase at radii where the absolute value of the electric field $E_\phi$ of the standing wave is at a maximum. In equation (18) one considers the rays 154 and 200 at two radii, which differ by the width W. The emitted rays 178 and 204 are then in phase, if they begin at radii which are essentially symmetric with respect to a radius with maximum absolute value of the electric field $E_\phi$. If the radial position of the boundary displacement 160 is in this way fine tuned with respect to the standing wave pattern, the total effect of two vertical rays 178 and 204 can be equivalently described by one vertical ray 205 outgoing from the rays 154 or 200 in the middle, between the two regions 180 and 202, where the absolute value of the field $E_\phi$ is at a maximum.

The left-hand portion of the FIGS. 4 illustrates the fine tuning of the radial position of the boundary displacements with a width W equal to one half of the wavelength of the mode with the circumferential order $m=1$. For example, the boundary displacement 160 is arranged symmetrically with respect to the local minimum 206 of the function $J_1'$, which is proportional to the electric field $E_\phi$ of the mode with $m=1$. The regions 180 and 202 with a complementary waveguide inhomogeneity are situated at consecutive zeros of $J_1'$, because of the particular width $W=\lambda_1/2$.

If the position of the boundary displacements of the center part 152 is radially fine tuned in this way, each grating line extracts power from the standing wave. The intensity of the standing wave decreases then exponentially with increasing radius as illustrated by the curves 29 in FIG. 1A.

After the description of the scattering of power from a standing wave by a single boundary displacement, the emission of power out of a standing wave by the grating will now be explained. For definitness vertical emission out of a standing wave pattern with one nodal line is considered. FIG. 7 shows a magnified view of the effective dielectric waveguide in FIG. 6 so that the curvature of the waveguide becomes visible. The radially fine tuned boundary displacements 210 and 212 scatter power out of the standing wave into the rays 214 and 216, as explained in conjunction with FIG. 6. The rays 214 and 216 describe the total effect of the respective boundary displacements and can therefore be though to begin in the middle of the boundary displacements. With reference to the arrows 138 in FIG. 5B, the electric field $E_\phi$ is symmetric with respect to the z axis. Therefore, the vectors of the electric field $\bar{E}_\phi$ in the middle of the boundary displacements 210 and 212 are equally directed as shown in FIG. 7. It is clear from FIG. 7 that the rays 214 and 216 are in phase along the z axis. Since the waveguide is curved, like a part of the surface of a sphere, all rays which are emitted perpendicular to the waveguide plane are in phase at the center of the sphere 218. The vertical emitted radiation is therefore focussed at the center of the sphere 218.

Since all the arrows 138 within a ring of energy pockets 132 in FIG. 5B have an equal oriented component in the direction of the nodal line 142, the emitted beam is symmetric with respect to the nodal line and is linearly polarized in the direction of the nodal line. The wave energy contained in a ring of energy pockets 132 decreases exponentially with increasing radius of the ring, due to the extraction of power out of the standing wave by the grating lines. The farfield of the emitted radiation is therefore highly collimated around an emission angle of $\pi/2$ and has a low side lobe level.

It is noted that a standing wave pattern of a mode with an even number m of nodal lines would produce an antisymmetric far field pattern, because of the antisymmetric electric field distribution mentioned in conjunction with FIG. 5A. This means in particular that this mode would not produce emission perpendicular to the waveguide plane. The farfield pattern would be given by a large number of cones highly collimated around the axis corresponding to vertical emission. It is further noted that the standing wave pattern of a mode with a higher odd circumferential order $m=3, 5, \ldots$ would produce a highly collimated symmetric farfield pattern, but with a minimum at the emission angle $\pi/2$.

It will now be explained how the mode with $m=1$ is selected from the ensemble of modes with an odd circumferential order. The grating lines of the outer part 22 are interrupted within a sector-shaped region 23 as can be seen in FIG. 1B. The radially counter propagating waves forming a standing wave are not back reflected within this uncorrugated region. Therefore, the quality factors of the resonator modes are reduced by the region 23. The resonator modes, which have a radial nodal line in the center of the region 23 suffer less extraction of wave energy. The lower the circumferential order m of such a resonator mode, the less wave energy is extracted, since the minimum of the electromagnetic field of both sides of a nodal line is broader for the lower order modes. This can be seen for example, by comparison of the intensity distributions in FIG. 5B and FIG. 5C of the modes with $m=1$ and $m=3$, respectively.

The mode with the circumferential order $m=1$ having the radial nodal line running through the center of the sectoral region 23 has the highest quality factor in comparison with the modes with higher odd integer orders $m=3, 5 \ldots$. Therefore, mode selection by means of the quality factor is made possible by the uncorrugated region 23 favoring the mode with one radial nodal line directed along the middle of uncorrugated region 23.

More generally, a mode with a particular circumferential order m can be selected by loading the resonator with losses in the area between the lines 24 and 25, which run perpendicular to the grating lines. The losses can be introduced, in particular, by varying the cross-section of the ridges and grooves circumferentially such that they provide less back reflection in the area between those lines, or by modifying the waveguide layers such that they absorb or scatter more power out of the guided wave in the area between those lines.

To further explain the action of the uncorrugated region 23, the properties of the emitted beam due to an omission of this region 23 will now be outlined. According to the equations (6) and (9), the standing wave pattern of the modes with odd integer orders m have a similar radial field distribution for larger radii. Since the arrangement of FIG. 1 provides back reflection only in the outer part 22, these modes will have substantially equal quality factors if the region 23 is omitted. For each higher order modes ($m=3, 5 \ldots$) the are with the highest energy density is essentially a ring 148 of energy pockets in the center of the standing wave pattern, as has been explained in conjunction with FIG. 5C. The radius of this ring increases with increasing order m of the mode. The more modes of consecutive orders m will contribute to the standing wave pattern, the more homogeneous will be the radial distribution of the stored wave energy. As a consequence, the volume energy density stored in the center part 20 in an ensemble of modes will be more homogeneous. A homogeneous energy density is useful, for example, in extracting a high total power from the resonator.

We now return to the description of the action of the arrangement in FIG. 1. It has been explained in conjunction with FIGS. 1 and 6 that the grating emits a bidirectional beam in the direction of increasing z values and in the direction of decreasing z values, respectively. The power in the beam emitted toward increasing z values can be enhanced by positioning appropriately all reflecting boundaries in the pathway of the ray emitted toward decreasing z values. Reflecting boundaries are in particular the boundaries between waveguide layers and (external) mirror layers. The positioning of a reflecting surface is now explained for the mirror layer 18. FIG. 8 shows a magnified portion of the center part 20 in FIG. 1. One recognizes the cladding layer 12, the central layer 10, the cladding layer 14, the mirror layer 18 and a ridge 220 in the central layer, which comprises waveguide inhomogeneities in the regions 222 and 224, in particular.

The ray 226 of the outgoing wave is bent toward the cladding layer 14 in the region 224 and scatters power into the ray 228. After reflection at the mirror layer 18, the ray 228 propagates toward increasing z values. In the region 224 the ray 228 scatters power along a ray 229 into the direction of the ray 230 of the incoming guided wave. It is noted that the rays 229 and 230 can be in or out of phase, depending on the spacing S, so that power is added to or extracted from the guided wave. Then, the ray 228 leaves the waveguide through the cladding layer 12. The ray 230 of the incoming wave is bent toward the cladding layer 12 in the region 224 and scatters power into the ray 232, which leaves the waveguide through the cladding layer 12.

In the region 224 of the waveguide inhomogeneity, the spacing S of the mirror layer 18 to the center line of the waveguide, which is given by the rays 226 or 230, is chosen such that the emitted rays 228 and 232 enhance each other as much as possible. Mathematically expressed, the rays 228 and 232 are in phase, if $$(\phi_{out}-\phi_{in})/(2\pi)+\Delta\phi_m+2S_2\bar{n}_2/\lambda+2S_1n_1/\lambda=k \quad (19)$$

where $\lambda$, $\phi_{in}$, $\phi_{out}$ and $n_1$, are noted, $$\bar{n}_2 = \frac{1}{S_2} \int_{(S_2)} n_2(z)dz \quad (20)$$

is the average along the z axis of the graded refractive index $n_2$, $S_1$ and $S_2$ are the distances shown in FIG. 8, $\Delta\phi_m$ is the phase change of the ray 228 due to the reflection at the mirror layer and k is an integer. For definiteness, $\Delta\phi_m$ is chosen equal to $\pi$ radians, which is the phase change of optical radiation at a high reflectivity gold layer.

It has been explained in conjunction with the equation (18) and the FIGS. 4A and 4B that the outgoing ray 226 and the incoming ray 230 are out of phase in the region 224 of a waveguide inhomogeneity, which means $\phi_{in}-\phi_{out}=\pm\pi$ radians, or without loss of generality $\phi_{in}-\phi_{out}=\pi$ radians. With these particular choices of $\Delta\phi_m$ and $\phi_{in}-\phi_{out}$, the equation (19) yields $$S_{opt}=k\cdot\lambda/2, \quad (21)$$

where $$S_{opt}=n_1S_1+\bar{n}_2S_2 \quad (22)$$

denotes the optical path length between the center of the waveguide in the region 224 and the mirror layer 18. Equation (21) means that, for the particular mirror layer with $\Delta\phi_m=\pi$, the optical path length has to be equal to an integer multiple of one half of the free space wavelength $\lambda$. In general, the optimum optical path length $S_{opt}$ depends through $\phi_{out}-\phi_{in}$ on the width W of the ridge 220 and on the fine tuning of the radial position of the ridges, as explained in conjunction with FIG. 6.

In dielectric waveguides the refractive indices $n_1$ and $n_2$ are often only slightly different so that one can set $n_1 \simeq n_2 \simeq n_{eff}$ to a first approximation. Equation (21) then reduced to $$S \simeq k\cdot\lambda/(2n_{eff}), \quad (23),$$

where the spacing S is noted and shown in FIG. 8. Equation (23) means that the spacing S has to be approximately equal to an integer multiple of one half of the wavelength $\lambda/n_{eff}$ in the waveguide.

The righthand portion of the FIG. 8 shows the intensity distribution $E_{rad}^2$ of the standing wave due to the reflection of the ray 228. The electric field $E_{rad}$ of the emitted ray 228 is parallel to the layers as has been illustrated in FIG. 6. The intensity distribution $E_{rad}^2$ has therefore a node at the (metal) mirror layer 18.

The layer 14 thus stores wave energy in a standing wave pattern, thereby forming an external resonator coupled to the guided-wave resonator. By increasing the spacing $S_2$ the amount of stored energy increases. The total quality factor of the two coupled resonators then also increases accordingly.

We consider now the general case of a cylindrical field distribution. We examine, in particular, the curvature of its cylindrical phase fronts and derive therefrom the directions of propagation of the phase fronts. Once the curvature of the phase fronts is determined, the construction of the cylindrical grating lines can be carried out, since the grating lines of a grating in accordance with the invention follow the curvature of the phase fronts.

Figure 9:
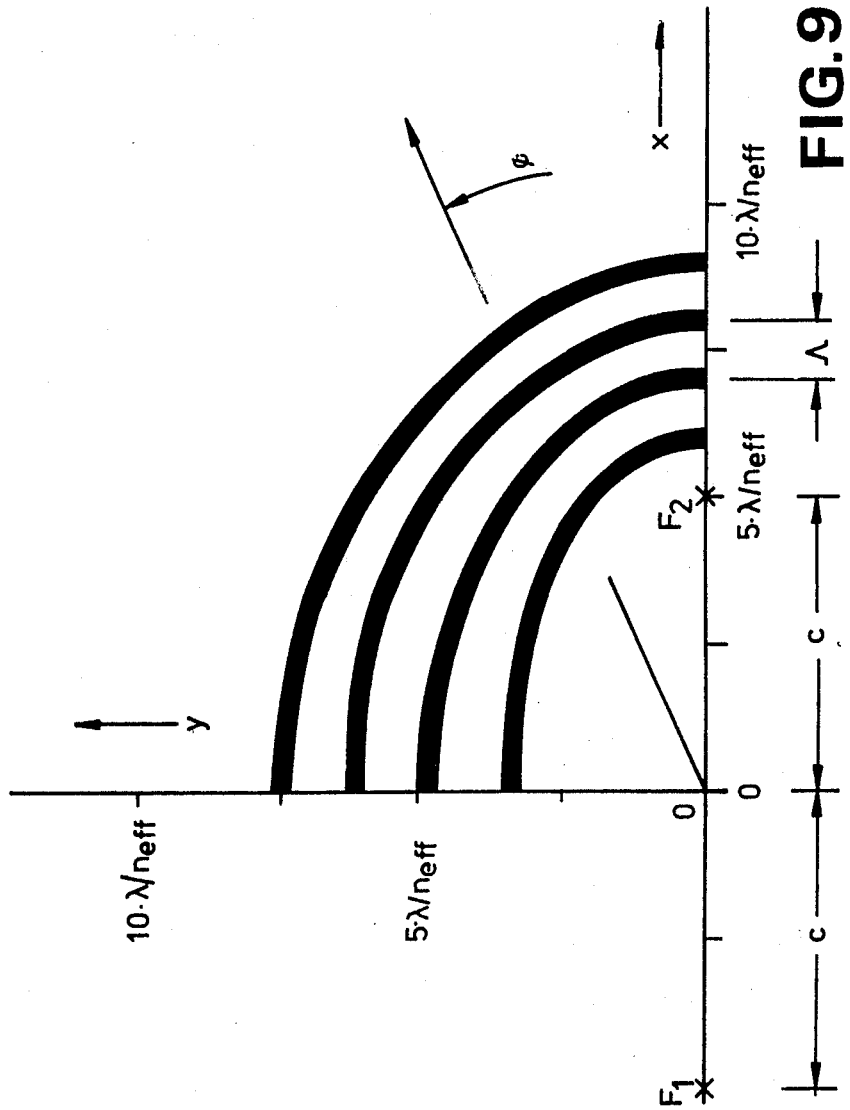
FIG. 9 is a plan view showing a section of an elliptical diffraction grating which may be used in the device of FIG. 1A in place of the circular grating illustrated in FIG. 1B.

It is known that Maxwell's equations have as solution a cylindrical field distribution with elliptical phase fronts. This means that grating lines following ellipses with two common foci represent an improvement in accordance with the invention. FIG. 9 illustrates a grating with elliptical grating lines, which can replace the circular grating in both the center part 20 and the outer part 22 in FIG. 1. In FIG. 9 the tops of the ridges in the central layer 10 are shown in solid black. Cartesian coordinates (x,y) and polar coordinates (r,$\phi$) are provided for orientation.

The grating of FIG. 9 consists of a plurality of elliptical ridges with two common foci $F_1$ and $F_2$, which are the distance $2c=10\cdot\lambda/n_{eff}$ part ($\lambda$ and $n_{eff}$ are noted). Mathematically the ellipses can be expressed by:

$$x=a\cdot\cos\phi \quad (24)$$

$$y=\sqrt{a-c}\sin\phi, a\geq c \quad (25)$$

where c is noted and a is the longer half axis of the ellipse. In FIG. 9, the connection line of the two foci coincides with the x axis, and the center 0 of the coordinate system is midway between the two foci.

A cylindrical wave with elliptical phase fronts can be described to a first approximation by the superposition of two in-phase circular cylindrical waves of equal amplitude, which have their axes at the foci $F_1$ and $F_2$, respectively. This will be explained below in greater detail. Since the distance 2c between the foci $F_1$ and $F_2$ in FIG. 9 is equal to a multiple of the wavelength $\lambda/n_{eff}$, the circular cylindrical waves essentially interfere constructively along the x axis outside the connection line $F_1F_2$ of the foci. By choosing the spacing $\Lambda$ of the ridges along the x axis substantially equal to $\lambda/n_{eff}$, the grating is operated along the x axis at one of its Bragg wavelengths according to equation (15) (second order grating). By choosing the width W of the ridges along the x axis substantially equal to $\lambda/(4n_{eff})$ the back reflection of an outgoing wave into an incoming wave is made particularly efficient according to equation (17). With the grating of FIG. 9 we aim for a standing wave pattern with one nodal line along the y axis. This wave pattern can be produced approximately by choosing, for the two circular cylindrical waves, the mode with the circumferential order m=1.

The position of the ridges is fine tuned for achieving distributed feedback along the x axis, if the centers of the ridges along the x axis are situated at distances from the origin 0 equal to $$a = c + k \cdot \lambda / n_{eff}, \quad (26)$$

where k=1, 2, ... is an integer. The position of the ridges is then fine tuned for achieving a standing wave pattern along the x axis for both circular cylindrical waves, as has been outlined in conjunction with the regions 192 and 193 in FIG. 4B.

Given the grating of FIG. 9 in the waveguide of FIG. 1, the elliptical mode with one nodal line along the y axis has a particularly high quality factor due to back reflection of an outgoing wave by the grating. Since we have the spacing $\Lambda$ of the ridges equal to the wavelength in the guide (second order grating), the grating is also coupling power from this resonator mode into a beam directed substantially vertically out of the plane of the waveguide. For a further investigation we may refer to the Mathieu functions, which give an exact description of waves with elliptical phase fronts.

Because of the linearity of Maxwell's equations, the superposition of two field solutions also represents a solution. According to the invention, the grating lines, which are provided in the waveguide, follow the curvature of the phase fronts of such a solution. Special grating curvatures can be of interest, for example to achieve a particular amplitude distribution or polarization of the beam emitted from the waveguide.

As a simple example we superimpose two in-phase circular cylindrical waves with their axes parallel shifted by the distance 2c. For definiteness we choose $$c = k \cdot \lambda / n_{eff}, \quad (27)$$

which means that the distance c is equal to an integer multiple k of the wavelength $\lambda/n_{eff}$ of a guided wave with plane wave fronts at the free space wavelength $\lambda$ (see equation (9)).

Figure 10:
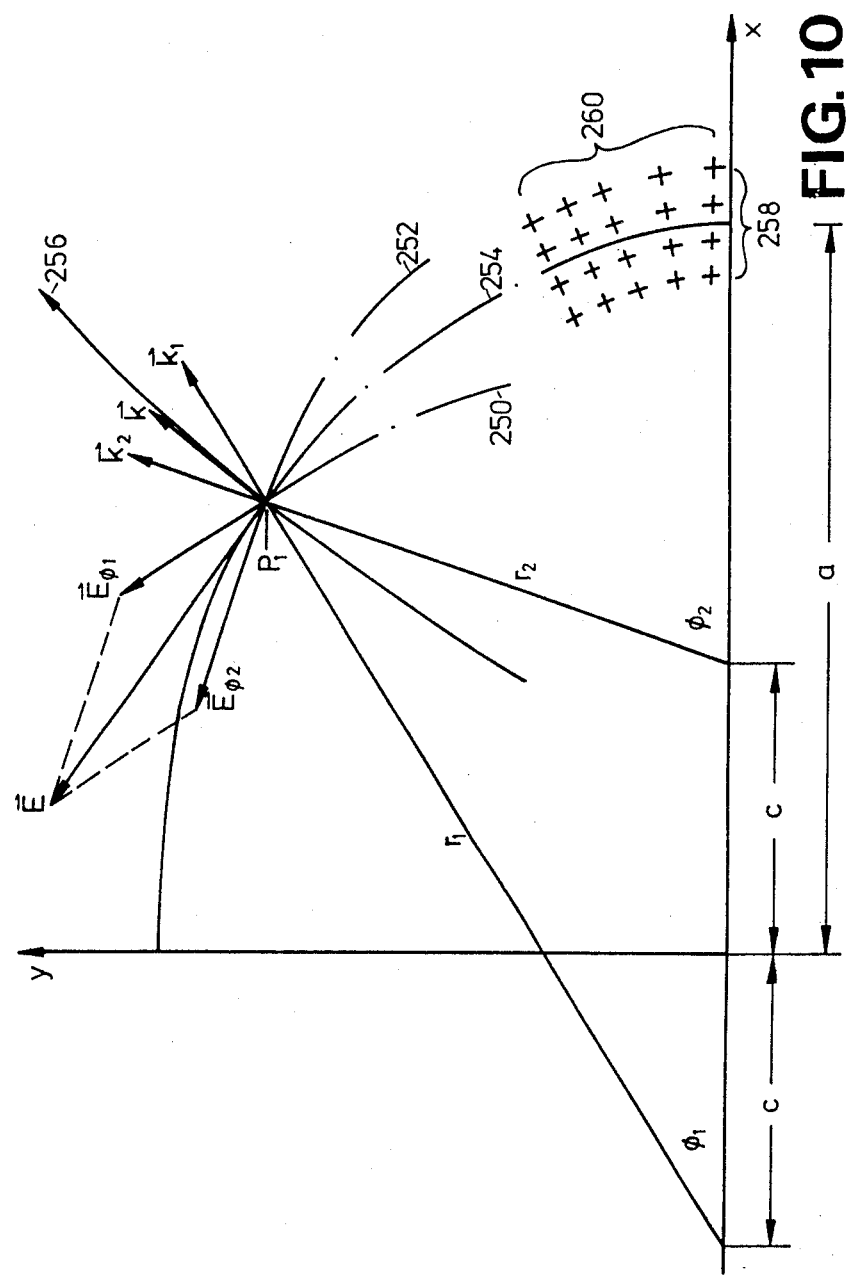
FIG. 10 is a graph illustrating the superposition of two circular wave components in a device of the type shown in FIG. 1A having an elliptical diffraction grating of the type shown in FIG. 9.

FIG. 10 illustrates the superposition of these two primary waves. The primary waves are represented by the respective wave vectors $\bar{k}_1$ and $\bar{k}_2$ and the vectors $\bar{E}_{100\ 1}$ and $\bar{E}_{\phi 2}$ of the respective electric fields. The wave vectors point in the directions of propagation of the primary waves. The electric field vectors $\bar{E}_{\phi 1}$ and $\bar{E}_{\phi 2}$ are perpendicular to the respective wave vectors and are oriented tangential to the respective phase fronts 250 and 252. Also shown is the vector $\bar{E}$ of the electric field of the sum wave. The vector $\bar{E}$ is oriented tangential to the phase front 254 of the sum wave. The normal vector $\bar{k}$ to the field vector $\bar{E}$ represents the wave vector of the sum wave. The wave vector $\bar{k}$ is oriented tangential to the ray 256 of the sum wave.

By superimposing the electric fields of the primary waves in each point of the x,y-plane one can draw the field 258 of tangents to phase fronts. Each point together with its respective tangent is called an element of the field of tangents. From the field 258 of tangents one derives the field 260 of directions of propagation by drawing in each point the direction of the normal to the tangent. Each point together with its respective direction of propagation is called an element of the field of directions. Successively connecting elements of the field of directions yields a ray 256 of the sum wave. Correspondingly successively connecting elements of the field of tangents yields a phase front 254 of the sum wave due to the superposition of two in phase circular cylindrical primary waves. Other cylindrical phase fronts may be constructed by superimposing an infinite number of circular cylindrical waves with different amplitudes and phases and with their axes parallel shifted to one another. A wave with cylindrical phase fronts thus is thought to be composed of a plurality of circular cylindrical waves (Huygen's principle). The curvatures of the phase fronts, which prescribe the curvatures of the grating lines and the curvatures of the rays, along which wave propagation takes place, can be constructed by means of the field of tangents to phase fronts and the filed of directions of propagation defined above.

Figure 11:
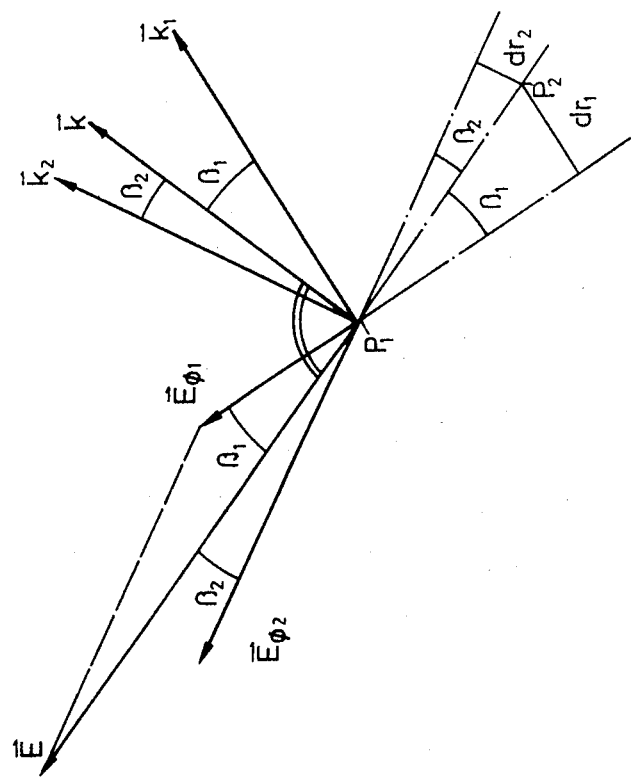
FIG. 11 is an enlarged view of a portion of FIG. 10 showing the area in the region of the point $P_1$.

For further illustration, we return to the simple superposition of only two in-phase circular cylindrical waves. We examine the curvature of a phase front 254. FIG. 11 shows the superposition of the two primary circular cylindrical waves in greater detail. If one goes a small distance along the phase front 254 from the point $P_1$ to the point $P_2$, the phase front 250 has to go forward (in the direction of $\bar{k}_1$) by the length $dr_1$ and the phase front 252 has to go backward (opposite to the direction of $\bar{k}_2$) by the length $dr_2$. Mathematically, it is $$dr_2/dr_1 = -\sin\beta_2/\sin\beta_1 \quad (28)$$

where the angles $\beta_1$ and $\beta_2$ are shown in FIG. 11. The negative sign occurs, since the phase fronts 252 is going backward. From the diagram of the electric field vectors in FIG. 11 one obtains $$E_{\phi 1}/E_{\phi 2} = \sin\beta_2/\sin\beta_1, \quad (29)$$

where $E_{\phi 1}$ and $E_{\phi 2}$ are the amplitudes of the electric field of the primary waves at the point $P_1$. Equation (28) and (29) yield $$E_{\phi 2}dr_2 = -E_{\phi 1}dr_1. \quad (30)$$

Equation (30) is the differential equation of a phase front in terms of the coordinates $r_1$ and $r_2$.

For a circular cylindrical wave, the field amplitudes follow for greater radii r essentially $\cos(m\phi)/\sqrt{r}$ as has been shown in conjunction with the equations (6) and (8) for a standing wave. For radii $r_1$ and $r_2$ much greater than 2c, and both circular cylindrical waves being in a circumferential mode of the same order m, the ratio $\epsilon = E_{\phi 1}/E_{\phi 2}$ is approximately constant.

The integration of equation (30) gives then approximately $$\epsilon r_1 + r_2 = d, \quad (31)$$

where d is a constant for each phase front. The constant d can be expressed for example by distances measured along the axis running through the two centers of the primary waves. In FIG. 10 this axis coincides with the x-axis. The phase front 254 intersects the x axis at the distance a from the point 0 in the middle between the two centers of the primary waves. Along the x axis it is $r_1 = a+c$ and $r_2 = a-c$ so that equation (31) yields $$\epsilon r_1 + r_2 = (1+\epsilon)\cdot a - (1-\epsilon)\cdot c \quad (32)$$

where all distances $r_1$, $r_2$, a and c are noted and shown in FIG. 10. It is understood that equation (32) has been obtained under the assumption $r_1$, $r_2 >> 2c$.

We now consider briefly the results of equation (32) for different values of $\epsilon$. For $\epsilon = 0$ we find circular phase fronts with radii $r_2 = a-c$, as expected. For $\epsilon = 1$ we find elliptical phase fronts with $r_1 + r_2 = 2a$. This shows that the superposition of two in-phase circular cylindrical waves of equal amplitude yields a first approximation for the construction of an elliptical wave, as stated above in conjunction with the discussion following the equations (24) and (25).

In conclusion, we have given a method for the construction of the curvature of cylindrical phase fronts which are possible according to Huygen's principle. Rules for the positioning of grating lines with respect to these phase fronts are given with the aim to achieve coupling between the cylindrical wave and a beam and, in particular, to achieve distributed feedback.

Preferred Applications of the Invention: FIGS. 12A and 12B illustrate a distributed feedback ("DFB") semiconductor diode laser in which stimulated emission is enhanced by an arrangement similar to that shown in FIG. 1. In addition, further means are provided according to the invention for efficient coupling of a waveguide mode and a vertical beam and for resonator mode selection.

FIG. 12A shows a cross-section of the laser device with a resonator similar to FIG. 1. The resonator is divided radially into a center part 300 and an outer part 302. The center part 300 contains a circular grating 304, which diffracts power out of waveguide mode mainly into substantially vertical beams 306 and 307, and contains a circular layer 308 capable of emission and amplification of optical radiation. The outer part 302 contains a grating 310, which provides mode selective distributed feedback, and contains an absorptive region 312 to select the resonator mode with one nodal line. The grating 304 of the center part and the grating 310 of the outer part are both in the lower cladding layer 324.

FIG. 12B shows a schematic top view of the gratings of the portion of the center and the outer parts, which is within the first quadrant of the indicated Cartesian (x, y) coordinates system. The cross-section of the arrangement in the FIG. 12A is oriented along the y axis. The resonator is built into a luminescence diode energized by carrier injection through a pair of contacts 314 and 316 in the form of rings, to allow vertical emitted radiation to leave the resonator. The contact 316 also acts as a mirror layer in the center part 300. The layer thicknesses of the waveguide in the center part 300 are fine tuned such that the beam 307 emitted from the grating 304 and reflected from the mirror 316 maximally enhances the power in the beam 306 emitted from the grating 304 in the other direction. This adjustment of the layer thicknesses has been explained in conjunction with FIG. 8.

The waveguide of the center part (radius: 50 micrometer) consists of a P-type GaInAsP central (active) layer 308, surrounded by a P-type GaInAsP upper confinement layer 318 and a P-type InP upper cladding layer 320 on one side and an N-type GaInAsP lower confinement layer 322 and an N-type InP lower cladding layer 324 on the other side. The refractive indices of the waveguide layers successively decrease, when going from the active layer 308 outward toward the cladding layers 320 and 324, respectively. The mole fractions and the doping of the quaternary layers 322 and 318 and of the quaternary active layer 308 are chosen to form a double heterostructure capable of emission and optical amplification around the free space wavelength $\lambda = 1.55$ micrometer, if energized by carrier injection.

The grating 304 of the center part consists of a plurality of concentric circular boundary displacements forming ridges and grooves in the lower confinement layer 322. The ridges have vertical walls of 0.22 micrometer height. The bottoms of the grooves closest to the central layer 308 are shown in FIG. 12B in solid black. The ridges have constant radial width $W_c$ and spacing $\Lambda_c$. The radial spacing $\Lambda_c$ of the ridges of 0.46 micrometer is made equal to the wavelength in the guide (2nd order grating) at the free space operating wavelength $\lambda$. The radial width $W_c$ is made equal to one half of the wavelength in the guide to maximize the vertical emission for the ridges with rectangular cross-section. The positions of the ridges are radially fine tuned to maximize the coupling of power from a circular standing wave pattern with one nodal line to vertical emitted radiation, as explained in conjunction with FIG. 6. (The centers of the ridges are situated along circles with radii equal to $(k+5/8)\lambda/n_{eff}$, where $\lambda$ is noted, k is an integer and $n_{eff}$ is the effective refractive index of the waveguide of the inner part).

The waveguide layers of the outer part 302 are essentially transparent at the free space wavelength $\lambda$. The lower cladding layer 324 is common with both the center part 300 and the outer part 302. The further layers are a GaInAsP central layer 326, a GaInAsP upper confinement layer 328 and an InP upper cladding layer 330. The upper cladding layer 330 of the outer part 302 has a region 312 consisting of two sectors (5 degree aperture angle) along the y axis with higher optical absorption, to provide means to select the mode with one nodal line along the y axis. This region 312 can be seen in FIG. 12A and FIG. 12B. The layer thicknesses and refractive indices of the waveguides of the center part 300 and the outer part 302 are adjusted such that the waveguides support only the fundamental mode. The waveguides of the center and outer parts are matched to one another by minimizing the difference of their effective refractive indices.

The grating 310 of the outer part (outer radius: 250 micrometer) consists of a plurality of concentric circular ridges and grooves in the central layer 326 in the boundary common with the lower cladding layer 324. The bottoms of the grooves in the central layer are shown in FIG. 12B in solid black. The ridges have vertical walls of 0.11 micrometer height and constant radial width W and spacing $\Lambda_0$. The radial spacing of the ridges $\Lambda_0$ of 0.23 micrometer is made equal to one half of the wavelength in the guide (1st order grating) and the radial width $W_0$ is made substantially equal to one quarter of the wavelength in the guide to maximize the back reflection of a guided wave as has been outlined in conjunction with FIG. 4. The concentric cross-section of the grating-waveguide configuration is different for two axes perpendicular to each other, with smooth transitions in between to provide further means for circumferential mode selection. This nonrotational symmetric cross-section is represented in FIG. 12B by a width $W_0$ of the ridges somewhat smaller than a quarter wavelength in the guide along the y axis. The radial position of the ridges is fine tuned such that they provide maximum distributed feedback for the resonator mode with one nodal line running parallel to the y axis. This fine tuning has been explained in conjunction with the FIG. 4. Care should be taken to take into account a residual difference of the effective refractive indices of the waveguides, which would make the wavelengths in the waveguide of the center part and outer part slightly different.

To provide a low electrical resistance path for the electrical current, the upper cladding layer 320 of the center part 300 contains a highly P-type doped region 332 and the lower cladding layer 324 contains a highly N-type doped region 334. The region 334 (radius: 70 micrometer) extends over the center part 300 and partly into the outer part 302. On the top and on the bottom of the layers of the outer part 302 are ring shaped $SiO_2$ isolation layers 336 and 338. The lower isolation layer 338 only covers the area adjacent to the highly doped region 334. In the center of the ring contact 316 (inner radius: 5 micrometer) on the resonator surface is formed a monolithically integrated lens 340. On the resonator surface opposite to the mirror layer is deposited an anti-reflection layer 342, to enhance the output coupling efficiency. The laser diode is mounted with the mirror layer 316 downward on a heat sink 344. The heat sink 344 has a conical hole 346 to allow radiation to be coupled in and out of the resonator. The laser diode is biased on one hand by a direct current I and has additionally a modulation current $\Delta I(t)$ flowing through it superimposed on the direct current I.

The waveguide layers are grown, lattice matched on the (100) surface of a monocrystalline InP substrate, by vapor phase epitaxy. First a GaInAsP etch stop layer (not shown in the FIG. 12) is grown, followed by the lower InP cladding layer 324. Then, the InP layer is highly doped by diffusion in the region 334. A resist is spinned onto the surface of the InP layer 324. The gratings 304 and 310 are fabricated by a conventional method such as exposing this resist with a computer-controlled electron beam which writes rings of the desired radii and widths. Thereafter, the grating grooves are created in the layer 324 by ion milling. The nonrotationally symmetric cross-section of the grating naturally occurs during the ion milling due to the nonisotropic structure of the monocrystalline InP layer and may be enhanced by appropriate writing with the electron beam.

The remaining layers are grown essentially by a two step vapor phase epitaxy on top of the gratings 304 and 310. First, the layer sequence of the center part 300 is grown and removed outside the center part 300 by mesa etching to expose the grating 310 of the outer part. Then, the layer sequence of the outer part is grown. The layers thereby grown over the center part 300 are used to form the lens 340 at the center of the grating by methods known for the formation of geodetic lenses. The remaining overgrowth of the center part is removed by selective wet chemical etchants to expose the upper cladding layer 320 of the center part. The upper cladding layer 320 of the center part of the grating is then highly doped by diffusion in the region 332. The concentric sector shaped absorptive regions 312 are created in the upper cladding layer 330 of the outer part 302 by flat proton implantation, followed by a thermal annealing step. After the deposition of the isolation layer 336, a ring shaped reflective contact layer 316 is affixed to the highly doped region 332. This contact layer 316 is electroplated to several micrometers thickness. Thereafter, the diode structure is soldered with the metal reflector downward onto a heatsink 344. The original substrate and the mentioned etch stop layer (not shown in FIG. 12A) are then removed by wet chemical etching, exposing the lower InP cladding layer 324. After the deposition of the circular anti-reflection layer 342 and a ring shaped isolation layer 338, a metal contact 314 is evaporated and electroplated onto the lower surface of the structure.

The diode laser shown in FIG. 12 has a simplified waveguide geometry in comparison to stripe geometry lasers, since it uses a one-dimensional waveguide instead of a two-dimensional waveguide. In comparison to laser diodes with stripe geometry, the current and carrier confinement to the active layer 308 is improved, due to the lower ratio of the circumference to the area of the active layer. The diode laser has a low threshold current, by restricting the active layer 308 to the center part 300 of the resonator with significant optical field. The diode mount has a low thermal resistance, due to the large area contacted to the heat sink 344.

The arrangement of FIG. 12 has the following optical properties: It can provide a highly collimated output beam, since the radiating cross-section is about two orders of magnitude larger than for stripe geometry semiconductor lasers. The emission occurs in a single mode and is linearly polarized, since the waveguide and grating configuration provide mode selection perpendicular to the layers and circumferentially. The emission can be made to occur in a narrow optical wavelength range, because of the high quality factor of the selected resonator mode and the high amount of optical energy storable in the cavity. By modulation of the injection current, intensity and phase modulation of the emitted radiation up to the Gigahertz frequency range can be achieved.

With the structure of FIG. 12 it has been shown that a thin film waveguide with a circular cylindrical grating can be used to produce laser action. $Ga_pIn_{1-p}As_qP_{1-q}$ double heterostructures lattice-matched to InP produce laser emission with a relatively low pump threshold in the free space wavelength range of about 1.1 to 1.65 micrometers. Laser operation in the near infrared (0.7-0.9 micrometer) can be achieved by $Al_pGa_{1-p}As$ heterostructures lattice-matched to GaAs.

Figure 13:
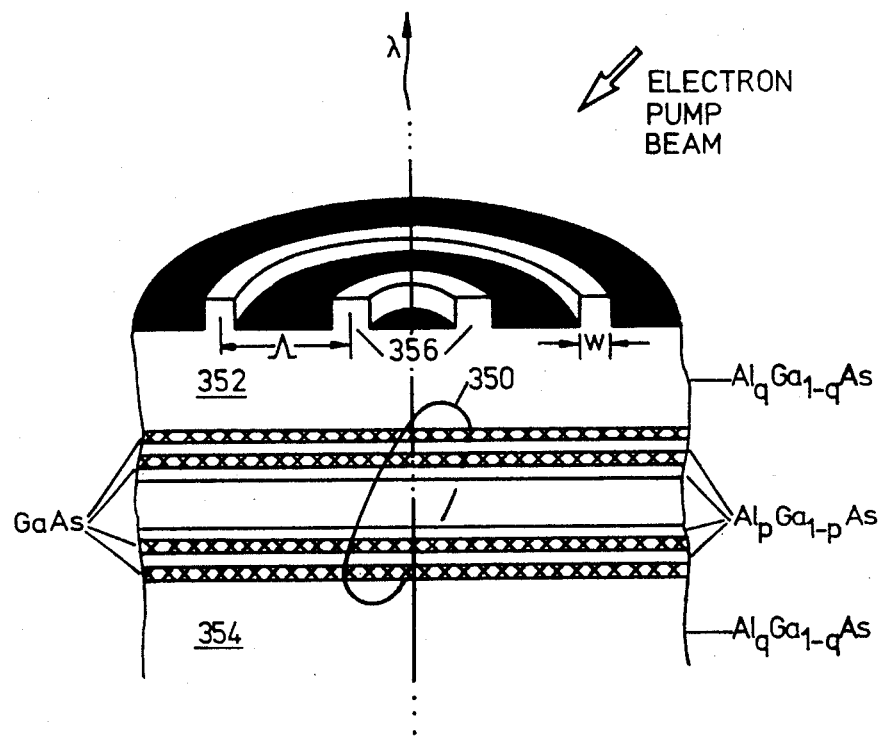
FIG. 13 is a partly cross-sectional and partly representational diagram of a multiple quantum well waveguide, having a diffraction grating according to the invention, and which can provide optical gain if pumped with an electron beam.

FIG. 13 shows a multiple quantum well waveguide formed by a plurality 350 of quantum well layers, which are alternatingly made of $Al_pGa_{1-p}As$ and GaAs, embedded between two $Al_qGa_{1-q}As$ cladding layers 352 and 354. The thickness of each of the quantum well layers is of the order of 20 nm or smaller. In the outer boundary of the cladding layer 352 is a circular grating 356 with rectangular ridges. The radial width W of the ridges is one quarter of the radial spacing $\Lambda$ of the ridges. The spacing $\Lambda$ of about 0.2 micrometers corresponds to the wavelength of the guided wave in the wavelength range, where the multiple quantum well structure can provide optical gain due to pumping with an electron beam.

Figure 14:
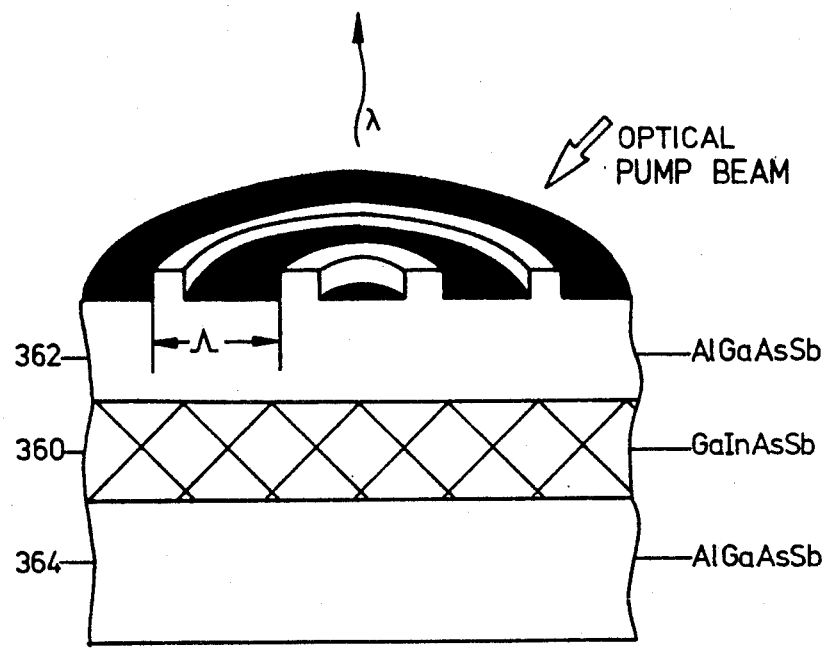
FIG. 14 is a cross-sectional and partly representational diagram of a double heterostructure waveguide, having a diffraction grating according to the present invention, and which can provide laser action if pumped by a short wavelength optical beam.

Laser operation in the mid-infrared ($\lambda=1.8-4$ micrometers) can be achieved with a GaInAsSb/AlGaAsSb double heterostructure lattice-matched to GaSb and provided with a cylindrical grating. FIG. 14 shows a double heterostructure formed by a $Ga_pIn_{1-p}As_qSb_{1-31\,q}$ central layer 360 embedded between two $Al_rGa_{1-r}As_sSb_{1-s}$ cladding layers 362 and 364. The GaInAsSb central layer is pumped by a short wavelength optical beam. The spacing $\Lambda$ of the ridges is equal to the wavelength of amplified guided waves so that laser action occurs at sufficiently strong pumping.

Figure 15:
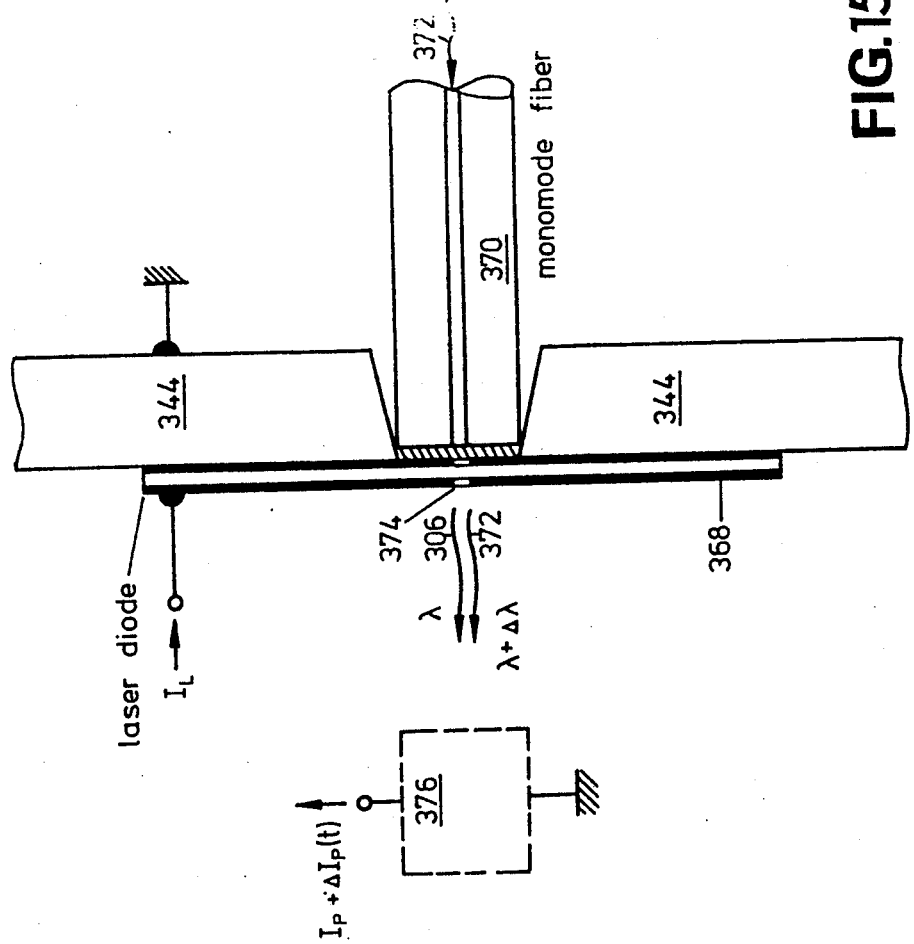
FIG. 15 is a cross-sectional, partly representational diagram illustrating how the diode laser of FIG. 12 may be coupled to a glass fiber to provide heterodyne detection with the aid of a photodiode signal transmitted by the fiber.

FIG. 15 shows the coupling of a cladded-core glass fiber 370 to the laser diode 368 according to FIG. 12. The fiber is a so-called single mode fiber. This means that it supports only the fundamental waveguide mode at the free space wavelength $\lambda$ of the laser radiation. The fiber is arranged to the lens 340 such that the beam 372, which is guided by the fiber 370, is coupled as a substantially vertical beam toward the outer part 304 of the grating. The polarization of the beam 372 coincides with the polarization of the laser diode output beam 306. The beam 372 has a small wavelength offset $\Delta\lambda$ with respect to $\lambda$. The beam 372 is amplitude or phase modulated. The polarization and phase matched beams 306 and 372 leave the resonator through the pin hole 374. The pin hole 374 is formed by decreasing the radius of the anti-reflection layer 342 and the inner radius of the contact 314 to the radius of the beam 372. The contact layer 342 then also acts as a mirror layer for the rays 306 to the sides of the pin hole 374. The thickness of the lower cladding layer 324 is therefore adjusted such that the reflected rays 306 interfere constructively with the rays 307. The mirror layers 314 and 316 form then a Fabry-Perot resonator being resonant at the free space resonance wavelength $\lambda$ of the guided wave resonator.

If the power carried by the injected beam 372 is much lower than the power of the laser output beam 306, the laser diode operation is not seriously influenced by the beam 306. If the wavelength difference $\Delta\lambda$ of the beams 306 and 372 is relatively small, the photodiode 376 can detect the beat note of the two beams, thereby realizing the heterodyne detection of the information stream carried by the injected beam 372.

Figure 16A:
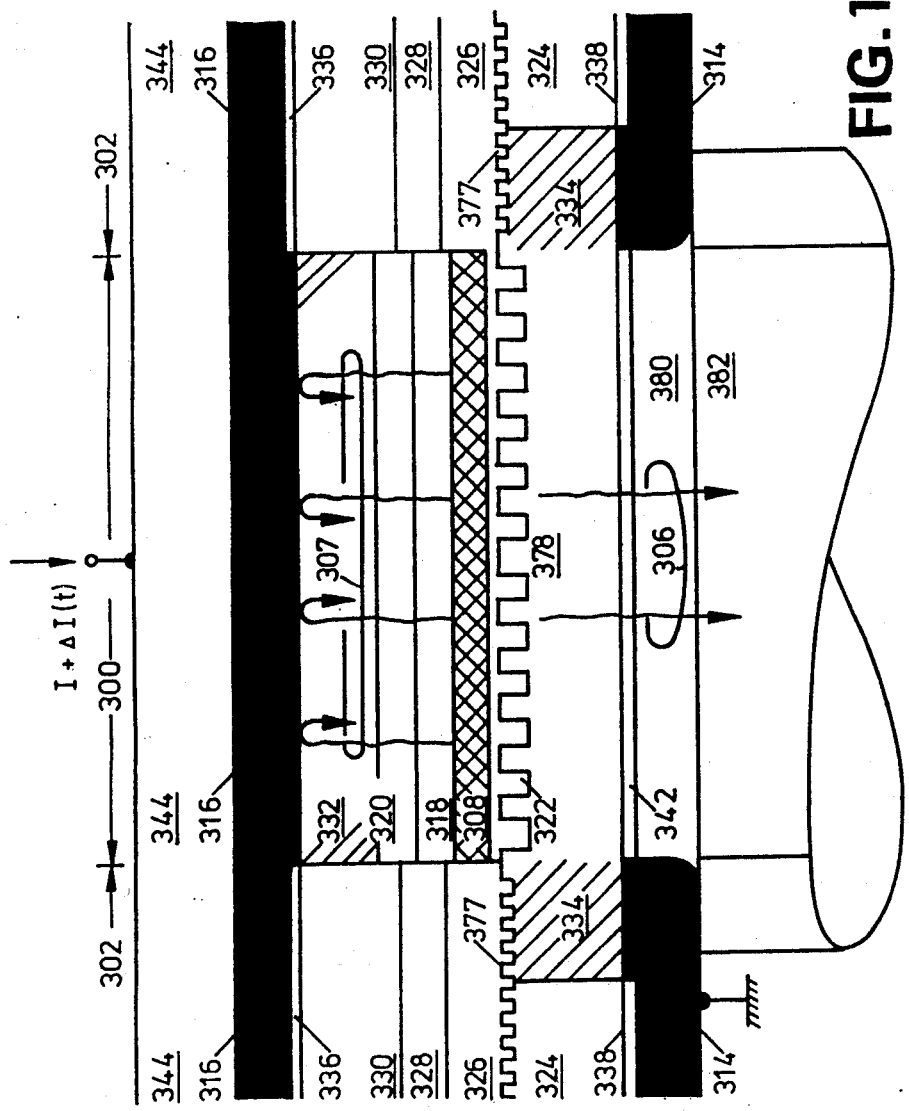
FIG. 16A is a cross-sectional and partly representational diagram of a laser diode similar to that of FIG. 12A but without means for circumferential mode selection.

FIGS. 16A and 16B show an arrangement similar to FIG. 12, but without means for circumferential mode selection. In particular, the ridges of the grating 377 of the outer part 302 have substantially constant width $W_o = \Lambda_o/2$ and the sector shaped regions 312 of higher optical absorption are omitted. The grating 378 of the center part 300 remains unchanged. Care is taken to account for a residual difference between the effective refractive indices along the x and y axis. The curvature of the grating lines therefore rather follows the curvature of the phase fronts of the standing wave patterns than the curvature of exact circles. The means 340 and 346 for rear output coupling are also omitted. Instead, the contact/mirror layer 316 covers the whole area of the center part 300. The beam 306 is then coupled via a transmission medium 380 into a cladded-core multimode fiber 382 with a core radius substantially equal to the radius of the inner part 300.

Since the resonator does not provide circumferential mode selection, the standing wave energy is shared by a plurality of modes with an odd integer number m of radial nodal lines. This results in a more homogeneous energy distribution within the resonator.

It has been pointed out in conjunction with the discussion of the standing wave patterns in FIG. 5 that a concentration of radiation energy is produced at the center of a cylindrical grating. This effect considerably enhances nonlinear interactions within the waveguide. FIG. 17 shows a grating-waveguide configuration similar to FIG. 1 but with a waveguide for surface polaritons. The waveguide includes a metal layer which is capable of second harmonic generation, if energized by a high intensity wave. The waveguide supports the fundamental pump wave and the second harmonic wave. These fundamental and second harmonic waves are phase matched, which means that the effective refractive index $n_{eff}$ of the waveguide is substantially equal for both waves.

The grating in this device is both (1) a first order grating providing distributed feedback in a mode with one radial nodal line for the fundamental wave, and (2) a second order grating providing emission into a linear polarized vertical beam for the second harmonic wave.

FIG. 17 shows a cross section of the waveguide structure. On a fused quartz substrate 400 is deposited a glass film 402 (Corning 7059) with a higher refractive index than the substrate. The thickness D of the film (about 1 $\mu$m) is adjusted such that the difference of the effective refractive indices for the fundamental wave and the second harmonic wave is as minimal as possible. In the glass film is formed a circular grating 404. On top of the grating is deposited a thin Ag layer 406 (5 nm thick). The radial spacing $\Lambda$ of two consecutive grating lines is equal to one half of the wavelength of the guided wave at the free space emission wavelength $\lambda = 1.064$ $\mu$m of a neodym:yttrium aluminum garnet (Nd:YAG) laser, which means that $\Lambda$ is about 0.35 $\mu$m. The radial width W of the ridges is equal to one half of the radial spacing $\Lambda$. The radial position of the ridges is fine tuned such that the grating lines provide distributed feedback for the fundamental wave for the mode with one radial nodal line and with the magnetic field oriented parallel to the layers of the waveguide. This means that the centers of the ridges are situated along circles with radii substantially equal to $(k+\frac{1}{2})\lambda/(2n_{eff})$, where $\lambda$ and $n_{eff}$ are noted k is an integer. The pump ray 408 is coupled as a guide wave radially into the resonator. The second-harmonic wave generated by the silver layer 406 is coupled into a beam 410, which is linearly polarized perpendicular to the direction of the pump ray 408.

A photodetector with internal photoemission enhanced by grating coupling to surface plasma waves is shown in FIG. 18. In this arrangement, a circular grating 420 with a radial spacing $\Lambda$ of consecutive ridges 422 and 424 of 2 micrometers and with a width W of the ridges equal to $\Lambda/4$ is fabricated photolithographically on a heavily doped p-type InP substrate 426. The height of the ridges is 0.1 micrometer. An electron-beam evaporated Au film 428 is deposited on the grating 420 to form a Schottky barrier. The gold film thickness is 50 nm. An ohmic contact 430 is thermally evaporated on the backside of the substrate 426.

A vertical beam 432 with a conical phase front 434 is irradiated along the symmetry axis 436 of the device. The irradiated beam 432 has a free space wavelength $\lambda$ of about 1 micrometer, at which the metal film 428 is normally almost totally reflecting. If the angle of incidence $\theta_i$ is such that the interface between the metal 428 and the air can guide a surface plasma wave, the quantum efficiency for the extraction of the photocurrent I is strongly enhanced. The axial intensity distribution for this case is illustrated by the diagram 438. This photodetector configuration is particularly good in attaining pico-second response speed with enhanced quantum efficiency.

FIG. 19 illustrates a microwave antenna according to the invention providing means with which millimeter waves are transmitted or received. The arrangement of FIG. 19 comprises a planar metal dielectric waveguide with a plurality of concentric circular ridges 450 in a highly reflecting metal surface. The radial spacing of the ridges (1 mm) is equal to twice the radial width of the ridges and equal to twice the height of the ridges. The metal grating is covered by a dielectric 452 (5 mm thickness) so that the wave energy is essentially confined to this dielectric. In the center of the waveguide is a coaxial feeder 454, which ends in a circular metal plate 456. The distance from the plate 456 to the metal surface is essentially equal to $\lambda/(2n)$, where $\lambda$ is the free space operation wavlength and n is the refractive index of the dielectric at the wavelength $\lambda$. Below the plate 456 the metal surface is uncorrugated in the region 458, which favors the formation circular wave fronts.

If a millimeter wave is fed through the coaxial waveguide it is coupled into a guided wave with concentric circular wave fronts. The ridges scatter the radiation into a beam 460 with generally coaxial wave fronts. If the wavelength $\lambda/n_{eff}$ of the guided wave is substantially equal to the spacing $\Lambda$ of the ridges, the emission occurs into a vertical beam 460. The emitted beam can be made linearly polarized, if the wave fed through the coaxial guide has one radial nodal line. The beam has a low side lobe level due to the smooth exponential decay in the radial direction of the near field of the antenna.

Figure 20:
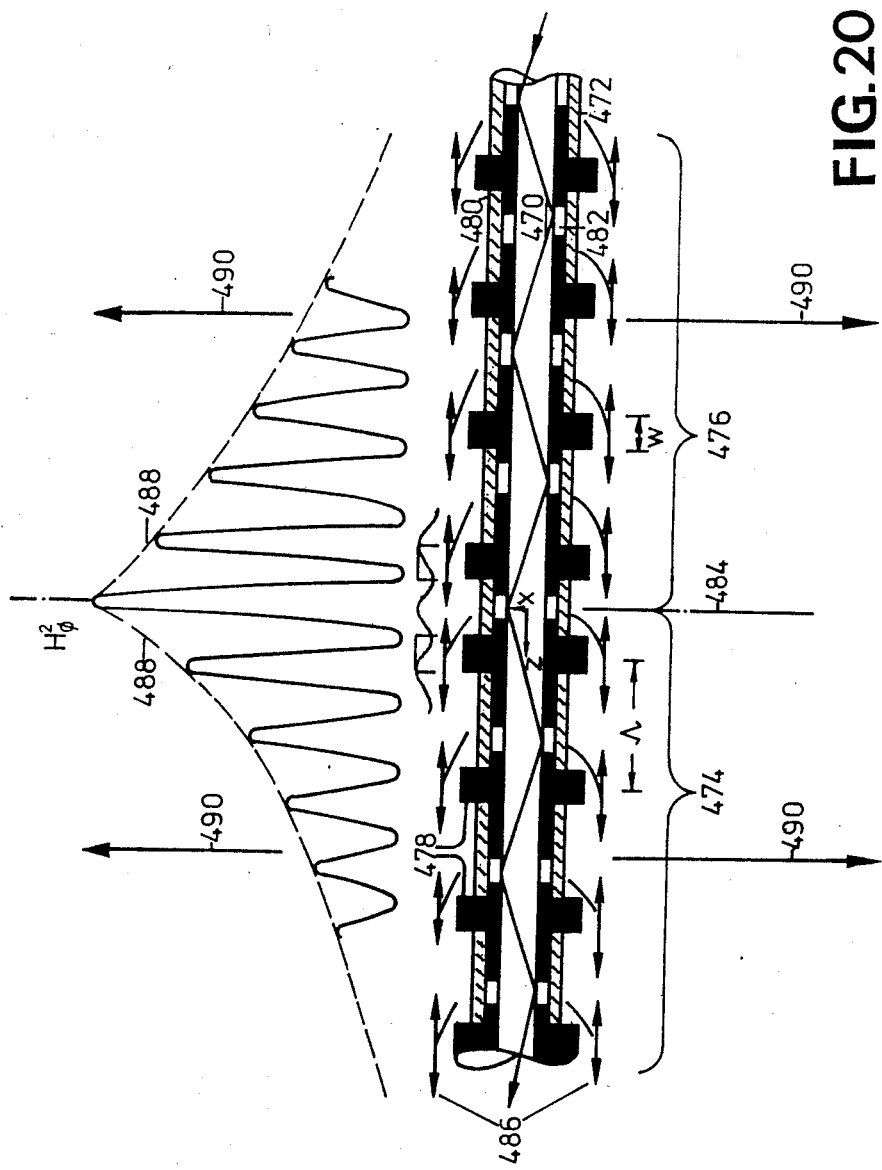
FIG. 20 is a cross-sectional and partly representational diagram of a cylindrical microwave waveguide employing a diffraction grating according to the invention.

FIG. 20 illustrates a rod-shaped microwave antenna according to the invention with which centimeter waves are transmitted or received. The arrangement of FIG. 20 comprises an inner circular metal hollow waveguide 470 and an outer circular metal-dielectric rod waveguide 472. The outer metal surface of the rod carries two sets 474 and 476 of closed loop metal ridges 478. Between the ridges 478 is a wave transmitting dielectric coating 480. In each set the ridges have a constant axial spacing $\Lambda$(1 cm) and have an axial width W equal to a quarter of the spacing $\Lambda$. The two sets of ridges are axially shifted together by the distance equal to a quarter of the axial spacing $\Lambda$ of the ridges. The inner waveguide 470 and the outer waveguide 472 are coupled by a plurality of slits 482. The slits have an axial distance $\Lambda$ equal to the axial distance of the ridges. The guided waves of the inner waveguide 470 and the outer waveguide 472 are phase matched by an appropriate choice of the thickness of the dielectric coating 480.

The power is fed to the antenna through the inner waveguide 470 in a waveguide mode without a radial nodal line. The power is then fed to the outer waveguide through the slits 482. If the length of the guided wave is equal to the axial spacing $\Lambda$ of the ridges, each set 474 and 476 acts as a second order grating. A guided wave which is axially outgoing from the center plane 484 is back reflected into an incoming guided wave by the ridges and superimposes in-phase onto the primary outgoing wave, due to the axial shift of the two sets 474 and 476. The axially counter propagating waves are illustrated by the bidirectional rays 486.

The standing wave pattern due to the two counterpropagating waves is illustrated by the curve 488. The curve 488 shows the square $H_\phi^2$ of the circumferentially oriented magnetic field due to the two axially counterpropagating waves along the cylinder axis. The intensity decreases exponentially with increasing axial distance from the center plane 484. Therefore, all of the energy is axially trapped if the rod resonator is sufficiently long. Since we have a second order grating, radiation is emitted vertically. This is illustrated by the rays 490 which lie in planes parallel to the center plane 484. The radiation pattern, as a function of the angular offset from the vertical direction, is symmetric, since the axial nearfield $H_\phi$ is symmetric with respect to the center plane 484. The emission is essentially equally intense in all radial directions in the plane 484, since the antenna is fed by a waveguide mode without a radial nodal line. The emission characteristic as a function of the angular offset from the vertical direction has a low side lobe level, due to the smooth exponential decay of the axial antenna nearfield.

There has thus been shown and described a novel cylindrical diffraction grating coupler and distributed feedback resonator for guided wave devices which fulfills all the objects and advantages sought therefor. Many changes, modifications, variations and other uses and applications of the subject invention will, however, become apparent to those skilled in the art after considering this specification and the accompanying drawings which disclose preferred embodiments thereof. For example, while diffraction gratings with circular and elliptical grating lines are shown and described, deviations from these specific closed loop structures will occur to those skilled in the art. All such changes, modifications, variations and other uses and applications which do not depart from the spirit and scope of the invention are deemed to be covered by the invention which is limited only by the claims which follow.

What is claimed is:

1. In an apparatus for controlling waves including a waveguide configured to confine and guide the energy of propagating waves and comprising at least one wave-transmitting medium having a substantially curviplanar boundary and a diffraction grating formed by a plurality of grating lines configured to scatter wave energy with respect to guided waves having phase fronts extending substantially parallel to said grating lines;
   the improvement wherein said grating lines form substantially closed loops consecutively enclosing each other from inner to outer.

2. The improvement defined in claim 1, wherein said grating lines are formed of physical ridges and grooves in said transmitting medium at said boundary.

3. The improvement defined in claim 1, wherein said wave-transmitting medium includes a plurality of media, each having a different wave transmission characteristic and wherein said grating lines are formed by the changes of the wave transmission characteristics.

4. The improvement defined in claim 1, wherein said waveguide includes means for exchanging energy with said guided waves in the vicinity of said diffraction grating.

5. The improvement defined in claim 4, wherein said guided waves are formed of electromagnetic radiation, wherein said waveguide includes means in said transmitting medium for converting electrical energy into electromagnetic radiation energy, and wherein said apparatus further includes means for injecting said electrical energy into said transmitting medium.

6. The improvement defined in claim 4, wherein said means for exchanging wave energy is provided in at least one sector shaped region bound by lines extending perpendicularly to said grating lines.

7. The improvement defined in claim 1, wherein the wave transmission characteristics of said transmitting medium are dependent upon the electric charge distribution within the transmitting medium and wherein said apparatus further comprises means for changing the charge distribution profile.

8. The improvement defined in claim 1, wherein said waveguide includes means for nonlinearly modifying said guided waves.

9. The improvement defined in claim 8, wherein the wave transmission characteristics of said transmitting medium are dependent upon the intensity of said guided waves.

10. The improvement defined in claim 8, wherein said modifying means includes a parametric frequency converter.

11. The improvement defined in claim 1, wherein said guided waves are selected from the group consisting of acoustic waves in a solid wave-transmitting medium and mechanical waves in a fluid wave-transmitting medium.

12. The improvement defined in claim 1, wherein said guided waves are formed of electromagnetic radiation and wherein said apparatus further comprises means for generating acoustic waves in said transmitting medium, whereby the acoustic waves produce said grating lines by producing variations in the density of the transmitting medium.

13. The improvement defined in claim 1, wherein an inner plurality of said grating lines of said diffraction grating form a first region and a further plurality of grating lines of the diffraction grating form at least one further region, the first region being surrounded by the further region, and wherein the grating lines in the first region produce a different scattering effect on said guided waves than the grating lines in the further region.

14. The improvement defined in claim 13, wherein the distance between successive grating lines in said first region is different than the distance between successive grating lines in said at least one further region.

15. The improvement defined in claim 13, wherein the cross-sectional shape of the grating lines in said first region is different from the cross-sectional shape of the grating lines in said at least one further region.

16. The improvement defined in claim 13, wherein said grating lines in said first region scatter energy between said guided waves and waves which are not guided by the waveguide and wherein said grating lines in said at least one further region back-reflect energy of said guided waves.

17. The improvement defined in claim 1, wherein the scattering effect of at least some of said grating lines varies along their longitudinal directions.

18. The improvement defined in claim 1, wherein at least some of said grating lines are interrupted in at least one sector bounded by lines extending perpendicular to said grating lines.

19. The improvement defined in claim 1, wherein at least some of said grating lines are interrupted in an annulus bound by lines extending parallel to said grating lines.

20. The improvement defined in claim 1, wherein the distance between at least some successive grating lines is $k\lambda 2$, wherein k is an integer and $\lambda$ is the wavelength of said guided waves.

21. The improvement defined in claim 1, wherein said guided waves are propagated along said waveguide in directions that are within a range of angles in which said boundary is totally reflecting, and wherein at least some of said grating lines form a cylindrical diffraction grating coupler by being spaced and shaped to cause an exchange of wave energy between said guided waves and waves propagating in directions outside of said range of angles, whereby said diffraction grating coupler scatters wave energy between the guided waves and waves which are not guided by the waveguide.

22. The improvement defined in claim 21, wherein the grating lines of said cylindrical diffraction grating coupler are spaced and shaped to scatter wave energy optimally at a 90 degree angle.

23. The improvement defined in claim 21, wherein said guided waves are formed of electromagnetic radiation and wherein said waveguide further includes means for reflecting the guided waves back and forth within the waveguide, thereby producing a standing wave pattern within the waveguide, and wherein the grating lines of said cylindrical diffraction grating coupler create spatial oscillations in the effective refractive index of the waveguide and wherein the loci of maxima of the oscillations of the effective refractive index are disposed substantially along phase fronts of the standing wave pattern, which run essentially along lines of maxima of the square of the field component oriented parallel to said boundary, thereby adjusting the position of the grating lines of the cylindrical diffraction grating coupler with respect to the standing wave pattern and that the efficiency of the cylindrical diffraction grating coupler is maximum.

24. The improvement defined in claim 21, wherein said guided waves are optical waves and wherein said apparatus further includes at least one cladded-core glass fiber for causing an energy exchange between said waves guided by said waveguide and waves guided by the fiber.

25. The improvement defined in claim 1, wherein at least some of said grating lines form a cylindrical distributed reflector by being spaced and shaped to cause an exchange of wave energy between guided waves propagating in opposite directions, whereby said diffraction grating back-reflects energy from said guided waves into said guided waves and produces a standing wave pattern within said waveguide.

26. The improvement defined in claim 25, wherein said guided waves are formed of electromagnetic radiation and wherein the grating lines of said cylindrical distributed reflector create spatial oscillations in the effective refractive index of the waveguide and wherein the loci of maxima of slopes, when going from an inner to a neighboring outer grating line, of the effective refractive index are selected from the group consisting of loci of maxima of positive slopes of the effective refractive index disposed along phase fronts which run essentially along lines of maxima of the square of the magnetic field in the standing wave pattern; and loci of maxima of negative slopes of the effective refractive index disposed along phase fronts which run essentially along lines of maxima of the square of the electric field in the standing wave pattern.

27. The improvement defined in claim 1, wherein said guided waves are formed of electromagnetic radiation and wherein said transmitting medium is capable of stimulated emission of electromagnetic radiation in the vicinity of said diffraction grating.

28. The improvement defined in claim 27, wherein said transmitting medium comprises a material having a direct band gap.

29. The improvement defined in claim 27, wherein said transmitting medium is selected from the group consisting of GaAs; $Ga_{1-x}Al_xAs$; $Ga_xIn_{1-x}As_yP_{1-y}$; and $Ga_xIn_{1-x}As_ySb_{1-y}$.

30. In a cylindrical waveguide configured to confine and guide the energy of propagating waves and including at least one wave-transmitting medium having a substantially cylindrical boundary and having disposed on said boundary a first diffraction grating, which comprises a plurality of substantially closed loop grating lines extending along said cylindrical boundary in planes parallel to the phase fronts of said guided waves and being spaced and shaped to scatter energy between said guided waves and waves which are not guided by said waveguide;

the improvement wherein said cylindrical waveguide further includes means for reflecting said guided waves back and forth in an axial direction within said waveguide, thereby producing counter-propagating guided waves forming a standing wave pattern within said waveguide, for enhancing the scattering of energy by said first diffraction grating.

31. The improvement defined in claim 30, wherein said means for reflecting said guided waves includes a second diffraction grating disposed on said boundary.

32. The improvement defined in claim 30, wherein said means for reflecting waves comprises said first diffraction grating; wherein the first diffraction grating is subdivided in two sets of grating lines; wherein the distance between two grating lines, which belong to different sets, is substantially equal to an odd integer multiple of one quarter of the wavelength $\lambda$ of said guided waves forming said standing wave pattern; and wherein, in each set of grating lines, the distance between neighboring grating lines is substantially equal to the wavelength $\lambda$.

33. The improvement defined in claim 30, wherein said guided waves are formed of electromagnetic radiation; wherein the grating lines of said first diffraction grafting create along the axis of said waveguide spatial oscillations in the effective refractive index of the waveguide; and wherein the loci of maxima of the oscillations of the effective refractive index are disposed substantially along phase fronts of said standing wave pattern, which run essentially along lines of maxima of the square of the field component oriented parallel to said boundary, thereby adjusting the position of the grating lines with respect to the standing wave pattern and that the efficiency of said scattering of energy by said first diffraction grating is maximum.

34. In an apparatus for the generation of a laser beam including a semiconductor laser resonator having a substrate and an active region deposited thereon, said laser beam being emitted out of said resonator essentially perpendicular to the surface of said substrate;

the improvement wherein said semiconductor laser resonator includes means for selecting the energy distribution in the standing wave pattern of a lasing mode in a plane parallel to said surface, thereby controlling the characteristic of said laser beam.

35. The improvement defined in claim 34, wherein said means for selecting said energy distribution consists of means for exchanging wave energy with the laser wave within said resonator.

36. The improvement defined in claim 35, wherein said means for exchanging wave energy is provided in at least one region having a base of the form of a sector, which lies in a plane parallel to said surface.

37. The improvement defined in claim 35, wherein said means for exchanging wave energy includes means for selecting the circumferential profile of the energy absorption within the resonator in a plane parallel to said surface.

* * * * *